United States Patent
Doraiswami et al.

(10) Patent No.: US 9,582,618 B1
(45) Date of Patent: Feb. 28, 2017

(54) APPARATUS AND METHOD FOR MONITORING ELECTRO- AND/OR MECHANICAL SYSTEMS

(71) Applicant: KING FAHD UNIVERSITY OF PETROLEUM AND MINERALS, Dhahran (SA)

(72) Inventors: Rajamani Doraiswami, Ottawa (CA); Lahouari Cheded, Dhahran (SA)

(73) Assignee: King Fahd University of Petroleum and Minerals, Dhahran (SA)

( * ) Notice: Subject to any disclaimer, the term of this patent is extended or adjusted under 35 U.S.C. 154(b) by 0 days.

(21) Appl. No.: 15/000,725

(22) Filed: Jan. 19, 2016

(51) Int. Cl.
*G06F 17/10* (2006.01)
*G06F 17/50* (2006.01)
*G05B 17/02* (2006.01)

(52) U.S. Cl.
CPC ......... *G06F 17/5009* (2013.01); *G05B 17/02* (2013.01)

(58) Field of Classification Search
CPC ............................ G06F 17/5009; G05B 17/02
USPC .......................................................... 703/2
See application file for complete search history.

(56) References Cited

U.S. PATENT DOCUMENTS

2014/0278303 A1* 9/2014 Larimore ............ G06F 17/5095 703/2
2014/0372091 A1* 12/2014 Larimore ............ G06F 17/5009 703/2

FOREIGN PATENT DOCUMENTS

WO    WO 2014/201455 A1    12/2014

OTHER PUBLICATIONS

Doraiswami et al. (Adaptive Kaman Filter for Fault Diagnosis of Linear parameter varying systems, 2014 (6 pages)).*

(Continued)

*Primary Examiner* — Kamini S Shah
*Assistant Examiner* — Andre Pierre Louis
(74) *Attorney, Agent, or Firm* — Oblon, McClelland, Maier & Neustadt, L.L.P.

(57) ABSTRACT

An apparatus and associated methodology that monitors a system. The method determines scheduling parameters of a system. The system includes a plurality of subsystems. The method determines diagnostic parameters of the system and generates a linear parameter varying (LPV) model. The LPV model relates an input, the diagnostic parameters, and the scheduling parameters to an output. In addition, the method monitors each of the plurality of subsystems as a function of the LPV model.

17 Claims, 11 Drawing Sheets

(56) References Cited

OTHER PUBLICATIONS

Tehrani et al. (Linear Parameter Varying Identification of Ankle Joint Intrinsic, 2013, (5 pages)).*
R. Doraiswami, "Modelling and Identification for Fault Diagnosis: A New Paradigm", Proceedings of the 2001 IEEE International Conference on Control Applications, Sep. 5-7, 2001, pp. 236-241.
R. Doraiswami, et al., "A New Diagnostic Model for Identifying Parametric Faults", IEEE Transactions on Control Systems Technology, vol. 18, Issue 3, Aug. 18, 2009, pp. 533-544 (Abstract only).
Salvador De Lira, et al., "LPV Model-Based Fault Diagnosis Using Relative Fault Sensitivity Signature Approach in a PEM Fuel Cell", $18^{th}$ Mediterranean Conference on Control & Automation, Jun. 23-25, 2010, pp. 1284-1289.
Habib Hamdi, et al., "Fault detection and isolation in linear parameter-varying descriptor systems via proportional integral observer", HAL, International Journal of Adaptive Control and Signal Processing, vol. 26, No. 3, Jul. 1, 2011, pp. 2-16.
Rajamani Doraiswami, et al., "Linear parameter-varying modeling and identification for condition-based monitoring of systems", Journal of the Franklin Institute, vol. 352, 2015, pp. 1766-1790.

\* cited by examiner

APPARATUS AND METHOD FOR MONITORING ELECTRO- AND/OR MECHANICAL SYSTEMS

TECHNICAL FIELD

The present invention relates to systems, apparatus, and methodologies for monitoring physical systems.

BACKGROUND

Condition monitoring, condition-based maintenance, and fault diagnosis of physical systems require a high probability of correct detection and isolation, a low false-alarm probability, and a timely decision on fault status. Fault diagnosis methods include model-free and model-based ones. Model-free based approaches include tools based on limit checking, visual analysis of data, plausibility analysis, Artificial Neural Network, and Fuzzy Logic.

A model-free approach may be capable of detecting a possible fault quickly, unraveling its root cause(s), and isolating it. Being free from the use of a model imparts an equally attractive freedom of the usual model-related difficulties such as identifying the required model, dealing with the presence of nonlinearities, and structural complexities.

However, these advantages are realized at a cost that could have various facets depending on the fault classification tool used. For neural networks, there is a lack of transparency, a need for a sufficient amount of training data covering most, if not all, operational scenarios, and a possibly lengthy training time. Fuzzy logic techniques, though less opaque than neural networks, suffer from the difficulty of deriving precise rules that distil an expert's knowledge of the application domain and which are necessary to drive the fuzzy inference engine. The model-based approach is based on the use of Kalman filtering, parity equation, system identification, and a diagnostic model.

A physical system is generally complex, nonlinear and the a priori information about the structure, based on the physical laws may not be available. For a large class of physical systems, a linearized model about some operating point may be employed, as it is mathematically tractable, and there are a wealth of readily available and powerful analysis and design tools. The linearized model, however, may not capture the behavior of the system over a wide range of operating regimes resulting from variations in the input and parameters of subsystems.

The foregoing "Background" description is for the purpose of generally presenting the context of the disclosure. Work of the inventor, to the extent it is described in this background section, as well as aspects of the description which may not otherwise qualify as prior art at the time of filing, are neither expressly or impliedly admitted as prior art against the present invention. The foregoing paragraphs have been provided by way of general introduction, and are not intended to limit the scope of the following claims. The described embodiments, together with further advantages, will be best understood by reference to the following detailed description taken in conjunction with the accompanying drawings.

SUMMARY

The present disclosure relates to a method for monitoring a system that determines, using processing circuitry, scheduling parameters of a system wherein the system includes a plurality of subsystems; determines, using the processing circuitry, diagnostic parameters of the system; generates a linear parameter varying (LPV) model wherein the model relates an input, the diagnostic parameters, and the scheduling parameters to an output; and monitors each of the plurality of subsystems as a function of the LPV model.

In one embodiment, the LPV model includes feature and influence vectors wherein the influence vectors are identified by experiments.

In one embodiment, an experiment includes perturbing diagnostic parameters and the input of the system.

In one embodiment, the feature vector and the influence vectors are estimated using a least squares technique using singular value decomposition.

In one embodiment, emulators are used to determine the diagnostic parameters.

In one embodiment, the emulators emulate variations in the phase and magnitude of the transfer function of each subsystem.

In one embodiment, the emulators emulate variations in parameters characterizing each subsystem.

In one embodiment, the processing circuitry schedules the LPV model to track variations and diagnostics simple or multiple faults.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein.

DETAILED DESCRIPTION

Figure 1:
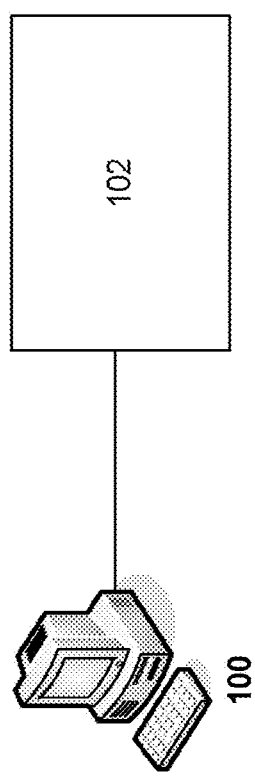
FIG. 1 is a schematic diagram of a system for monitoring of physical systems according to one example.

Referring now to the drawings, wherein like reference numerals designate identical or corresponding parts throughout several views, the following description relates to an apparatus and associated methodologies for monitoring a status of a system. The methodologies models and identifies the system. The methodology described herein applies to a broad range of variable structure machines, systems such as aircrafts, robot manipulators, ships, mechatronic systems, multi-machine power systems, power electronics devices, and automotive systems, and/or changing constant conditions systems. In addition, the methodologies described herein may be applied to soft sensor design and development for a variety of applications such as fault diagnosis, process control, instrumentation, signal processing, and the like. Soft sensors are used in aerospace, pharmaceutical, process control, mining, oil and gas, and healthcare industries.

High order and nonlinear physical systems have been modeled as linear parameter-varying (LPV) systems for designing gain-scheduling controllers, fault diagnosis schemes, and real-time simulation to predict the integrity of the system under different operating scenarios. Fault Detection and Isolation (FDI) schemes based on linear time-invariant systems are not reliable when the parameter perturbations are large around an operating point. FDI schemes using LPV models are used for approximating a class of nonlinear systems by LPV systems, for example, as described in B. F. Pettersson et al., "Linear Parameter Varying Description of Nonlinear systems", Proceedings of the American Control Conference, (pp. 1374-1379). Using design methods based on robust $H_2$, $H_\infty$ and $\mu$-analysis in the framework of Linear Matrix Inequality constraints (LMI), an LPV model provides a systematic method to design a gain-scheduled controller. A family of plants may be identified for operating points corresponding to a set of diagnostic parameter values. Using the identified model, a robust controller is designed for each operating point, and is then switched according to some gain-scheduling policy.

The LPV model described herein is a function of scheduling parameters and diagnostic parameters. The LPV model handles the diagnosis of parametric faults. The LPV model may handle diagnosis of simple and multiple faults resulting from simultaneous degradation of one or more components of nonlinear systems. The LPV model relates the input, diagnostic parameters, and scheduling parameters to the output. Diagnostic parameters are parameters that are subject to failure. Although the system described herein refers to a single variable case, it is understood that the methodologies described herein may be applied to a multivariable case.

Figure 9:
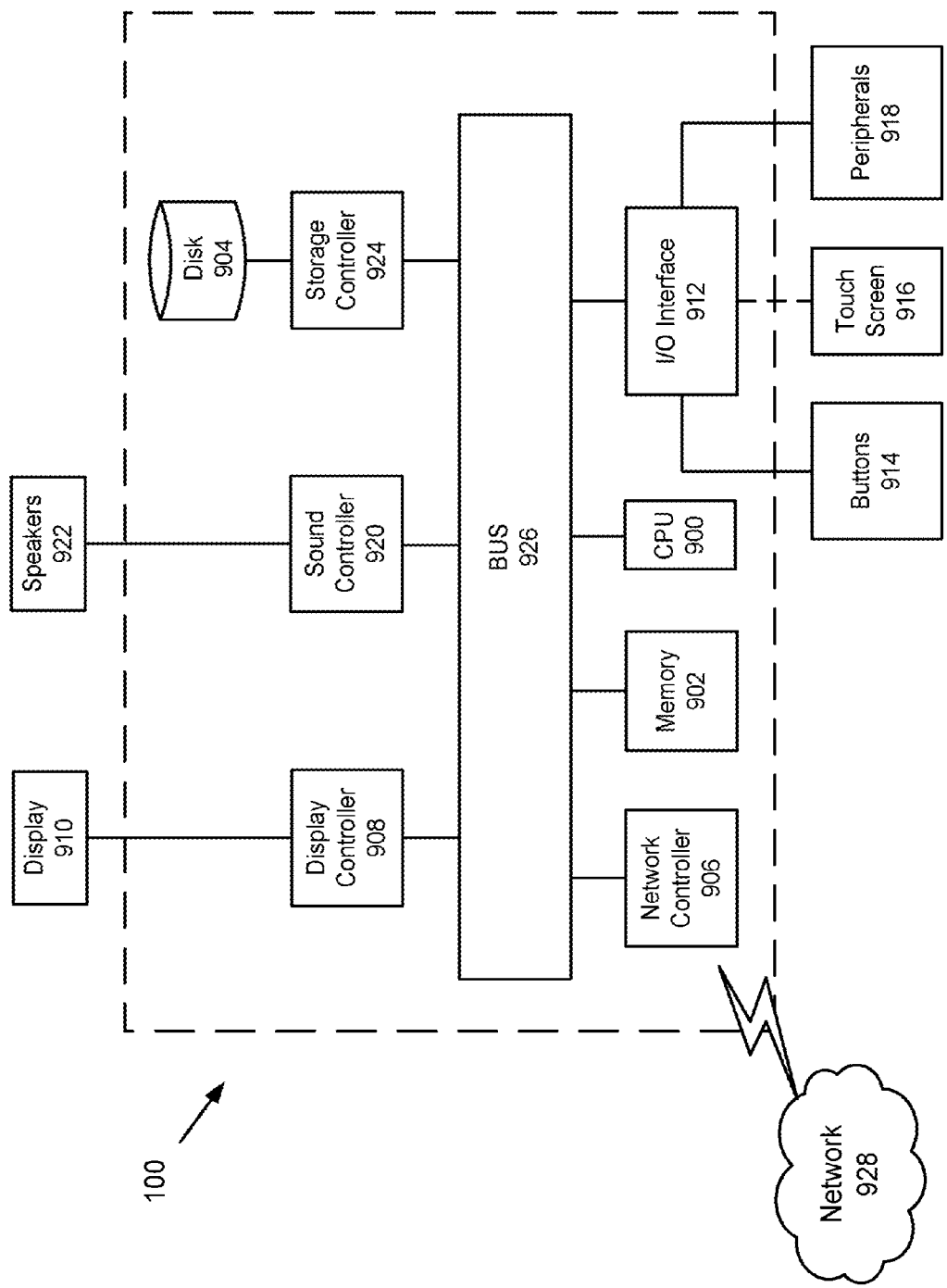
FIG. 9 is an exemplary block diagram of a server according to one example.

FIG. 1 is a schematic diagram of a system for monitoring of a physical system according to one example. FIG. 1 shows a computer 100 connected to a machine or system 102. The computer 100 includes a CPU 900 and a memory 902, as shown in FIG. 9.

The machine or system 102 may be a combustion engine, an aircraft speed and altitude, an energy generation system, an air conditioning system, a robotic system, or the like. Data from the system 102 may be collected in any of a plurality of methods. For example, the data may be collected from probes or sensors that collect and transmit data to the computer 100. Using the data, a dynamic model may be constructed. For example, sensor may detect any desired condition, for example movement, vibration, speed, displacement, compression, and the like. The sensors may be coupled to the machine or system 102, such as an engine, motor, suspension component, and the like. In addition, when data is not available from sensors, emulators are used as described herein.

Figure 2:
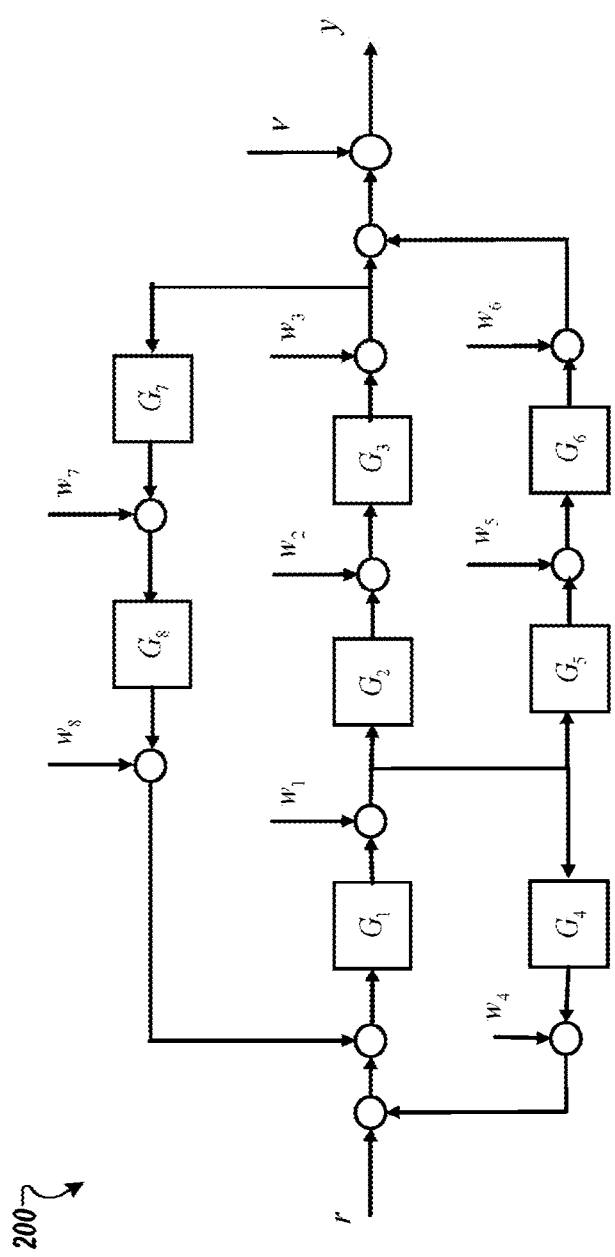
FIG. 2 is an exemplary system formed of interconnections of subsystems according to one example.

FIG. 2 is an exemplary schematic that shows an interconnected system 200 formed of a number of subsystems. Each subsystem may represent a physical entity such as a sensor, actuator, controller, or any other system component that is subject to variations. Each subsystem may be affected by noise or disturbance inputs. In FIG. 2, $w_i$ represents the noise and disturbances affecting the subsystems and v as the measurement noise. For example, changes in the dynamic behavior of an aircraft may occur from fatigue, damage, wear, and the like.

A subsystem may be completely described by a feature vector, which is a vector formed by the coefficients of the numerator and denominator polynomials of the subsystem transfer function. Each subsystem faults occurs when ore more transfer function parameters change. Except in the case of subsystems such as a controller, the feature vector used to characterize any other subsystem is impractical as it is not accessible and the number of its elements may be large.

Therefore, in order to reduce the complexity of the model and the computational requirement, the number of diagnostic parameters to be used for a subsystem are selected minimal but large enough to capture the important deviations in the behavior of the subsystem. In many applications, the parameters that determine deviations in the subsystem's gain and phase at the normal operating frequency are adequate as the diagnostic parameters. That is, the diagnostic parameters may be a function of the parameters that determine derivations in the subsystem's gain and phase. For example, a subsystem with faster dynamics such as a sensor or an actuator may be characterized by its gain only, while a plant with a slower dynamics may be characterized by both its gain and phase. The diagnostic parameters may be used to determine the presence or absence of a fault as described further below.

When a model is identified under various operating scenarios, the identified model is likely to capture the system's behavior in these operating regimes based on the exemplary evaluation of the method on simulated and physical systems. For example, in an artificial neural network approach a training set comprising data obtained from a number of representative scenarios is presented to the network to estimate the weights and then once trained, the network can then be used as a model for similar unseen scenarios.

The LPV model for fault diagnosis is completely characterized by a feature vector and influence vectors. The influence vectors are identified by performing a number of off-line experiments. Each experiment consists of a) perturbing one or more diagnostic parameters and b) varying the system input. In order to reduce the computational burden, during identification of an LPV model, an efficient recursive identification of the influence vector is used as described herein. The influence vectors are functions of the operating point used, which in turn is determined by the scheduling variables. Thus, the influence vectors are identified for each of value of the scheduling variables. An emulator may be connected in cascade with the system model at either the input or output or both, during the identification stage to meet the requirement of the accessibility of the subsystem parameters. A fault may arise either as a result of variations in the phase and magnitude of the transfer function of a subsystem, in which case it termed as a non-parametric faults or as a result of variations in the parameters characterizing the subsystem, in which case it is then termed as a parametric fault. The emulator transfer function may be a Blaschke product of first-order all-pass filters. Each first-order filter has two parameters. A first parameter characterizes the gain. The second parameter characterizes the phase as described in Saito, N., and Letelier, J. R, "Amplitude and phase factorization of signals via Blaschke Product and its applications", Japan Society for industrial and applied mathematics (2009). The emulator can emulate both a non-parametric and parametric fault in the subsystem. The complexity of the identification method described herein is merely of the order of the number of diagnostic parameters for simple faults. However, the complexity increases when multiple faults resulting from simultaneous variations in the diagnostic parameters are considered.

The model-based approach for fault diagnosis generates a signal termed "residual" which, in an "ideal" case, is zero when there is no fault and non-zero otherwise. The "ideal" case refers to the situation where the model of the system 102 is precisely known and there are no disturbances or measurement noise affecting the system. In many applications, the model of the system is an approximate representation of the system's dynamics and the noise and disturbances are either partially or totally unknown.

Residuals may be determined by the CPU 900 using a plurality of methods such as Kalman filter- or observer-based approaches, parameter estimation methods, parity vector methods, or other techniques as would be understood by one of ordinary skill in the art. Model uncertainties and robustness to disturbance may be determined using fault detection schemes, including approaches based on the unknown input observers, eigenstructure assignments and $H_\infty$-based optimal detection filters. In one embodiment, the method described herein employs a Kalman filter. Kalman Filters are used for estimation and filtering in the presence of measurement noise and disturbances in many areas of science and engineering. Kalman filters are used for fault detection and isolation of faults which are modelled as additive exogenous signals. An efficient scheme for the isolation of parametric faults is described herein where a fault is modelled by parameters that characterize subsystems or devices.

In one example, the system and associated methodology described herein is evaluated on a physical laboratory-scale position control system. The objective of identification is to develop a fault diagnosis scheme to detect and isolate sensor and actuator faults.

Consider the interconnected system 200 formed of a number of subsystems denoted by their transfer functions $\{G_i: i=1, 2, \ldots m\}$. Each subsystem may represent a physical entity such as a sensor, actuator, controller or any other system component that is subject to parametric faults, and may be affected by noise or disturbance inputs $\{w_i\}$, as shown in FIG. 2. The parameters that characterize the behaviour of a subsystem may be identified online. Then, the identified parameters may be used to monitor faults of the subsystem.

Considering the case of a physical system where it is not possible to identify online each of the subsystem models from the available input-output data. In other words, considering an exemplary case where it is difficult to determine how the parameters of the subsystems enter the identified model. In this case, the system may be modelled with emulators connected in cascade with the system input and output to emulate the behaviour of the inaccessible subsystems. The parameters of the emulators are termed diagnostic parameters. During the offline identification stage, the diagnostic parameters are varied to emulate faults in the subsystems, and during the operational stage, the diagnostic parameters are estimated online to monitor the occurrence of any subsystem faults.

Consider an $i^{th}$ subsystem whose transfer function may change due to some degradation or the occurrence of a fault or may vary from one operating regime to another. Such a variation may be written from the nominal transfer function by the following multiplicative perturbation model:

$$G_i(z) = G_{0i}(z)(1 + \Delta G_i(z)) \tag{1}$$

where $G_{i0}(z)$ is the nominal transfer function and $\Delta G_i(z)$ is the perturbation. Except for a physical system such as the controller, the parameters of $G_i(z)$ are assumed to be not accessible. An emulator is a transfer function block which is connected in cascade with a subsystem or a device such as a sensor or an actuator or the plant with a view to emulating faults in the inaccessible parts of the overall system. The system model is augmented to include the emulators. In the case of a controller, the controller also plays the role of an emulator as the parameters are accessible. A fault in a subsystem may be determined by monitoring either (a) a variation in the phase and magnitude of the transfer function or (b) variations in the parameters characterizing the subsystem. Monitoring the variation in the phase and magnitude of the transfer function gives a macroscopic picture of a fault, while monitoring variation in the parameters characterizing the subsystem gives microscopic details of the faults. For example, a fault in an electric motor may be detected from the macroscopic picture of its frequency response or from the microscopic details of the variations in its physical parameters such as its inductance, resistance, and inertia. The emulator can emulate either of the 2 types of fault manifestations in the subsystems to which it is connected in cascade. Consider the $i^{th}$ perturbed subsystem given by equation (1). An emulator $E_i(z)$ connected in cascade with the subsystem to simulate the perturbation may be expressed as:

$$G_i(z) = G_{0i}(z)(1 + \Delta G_i(z)) = G_{0i}(z) E_i(z) \tag{2}$$

The macroscopic status of the subsystem can be expressed by the following gain-phase model with delay:

$$E_i(z) = \gamma_1 + z^{-d}\left(\gamma_{n_{E_i}} \prod_{l=2}^{n_{E_i}-1} \frac{\gamma_l + z^{-1}}{1 + \gamma_l z^{-1}}\right) \tag{3}$$

where $n_{E_i}$ is the number of diagnostic parameters of the emulator $E_i(z)$, $z^{-d}$ emulates time delay of d time instants. The first term in equation (3) represents merely the gain while the second term in equation (3) is a Blaschke product of first-order all-pass filters to emulate the phase variations in the subsystem's phase. Examples of emulators include simple gain, gain and a first-order all phase filter, and a gain and a second-order all-phase filter are given below:

$$E_i(z) = \begin{cases} \gamma_1 & \text{gain} \\ \gamma_1 + \gamma_3 z^{-d} \dfrac{\gamma_2 + z^{-1}}{1 + \gamma_1 z^{-1}} & \text{gain and first-order all-pass filter} \\ \gamma_1 + \gamma_4 z^{-d}\left(\dfrac{\gamma_2 + z^{-1}}{1 + \gamma_2 z^{-1}}\right)\left(\dfrac{\gamma_3 + z^{-1}}{1 + \gamma_3 z^{-1}}\right) & \text{gain and second-order all-pass filter} \end{cases} \tag{4}$$

Time delay in the emulators is included to allow modelling a larger class of practical fault-generation mechanisms, ranging from those with no delay at all (instantaneous ones) to those with a non-negligible delay.

The emulator that captures completely the parameters of a minimum phase subsystem may be expressed as:

$$E_i(z) = G_{0i}^{-1}(z)G_i(z) \tag{5}$$

Figure 3:
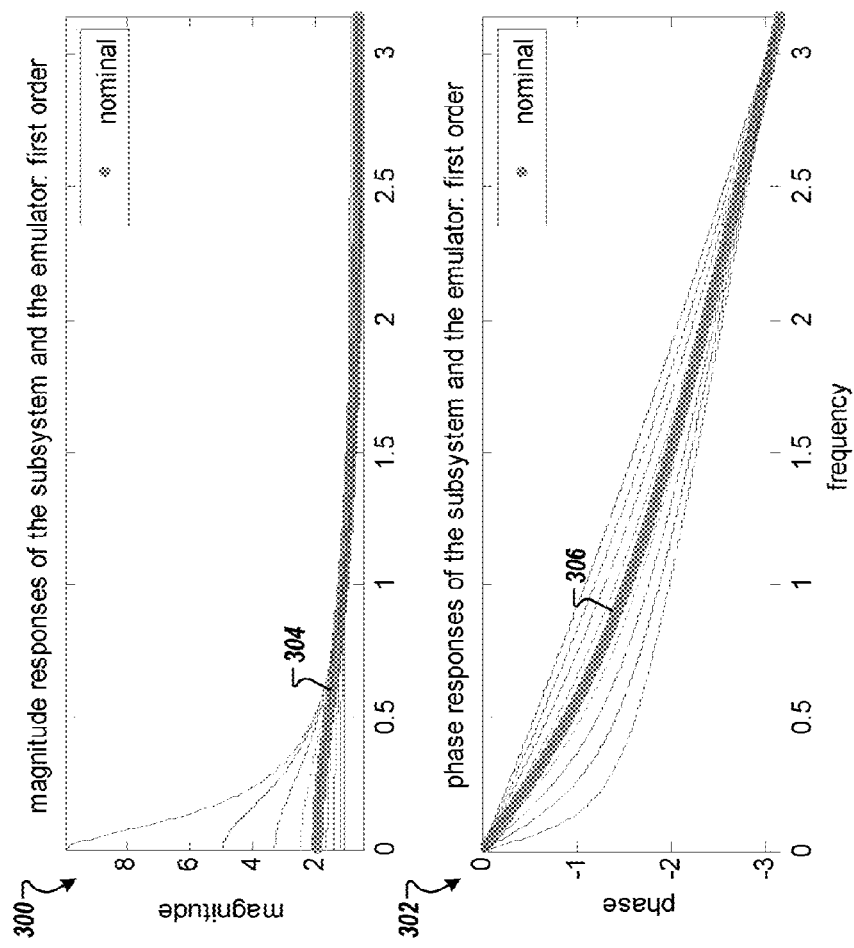
FIG. 3 is a schematic that shows gain and phase plots of a perturbed subsystem with a first-order emulator according to one example.

FIG. 3 is a schematic that shows gain and phase plots of a perturbed subsystem with a first-order emulator according to one example. The frequency responses (magnitude and phase) of the perturbed subsystem G(z) are shown in FIG. 3 as the parameters of the emulators are varied. Graph 300 shows magnitude responses of the subsystem with the first-order emulator. Graph 302 shows phase responses of the subsystem with the first-order emulator. Trace 304 is the magnitude of the frequency response of the nominal unperturbed transfer function $G_{0j}(z)$. Trace 306 is the phase of the frequency response of the nominal unperturbed transfer function $G_{0j}(z)$. In graphs 300 and 302 the perturbation parameter changes from 0 to $\pi$.

Figure 4:
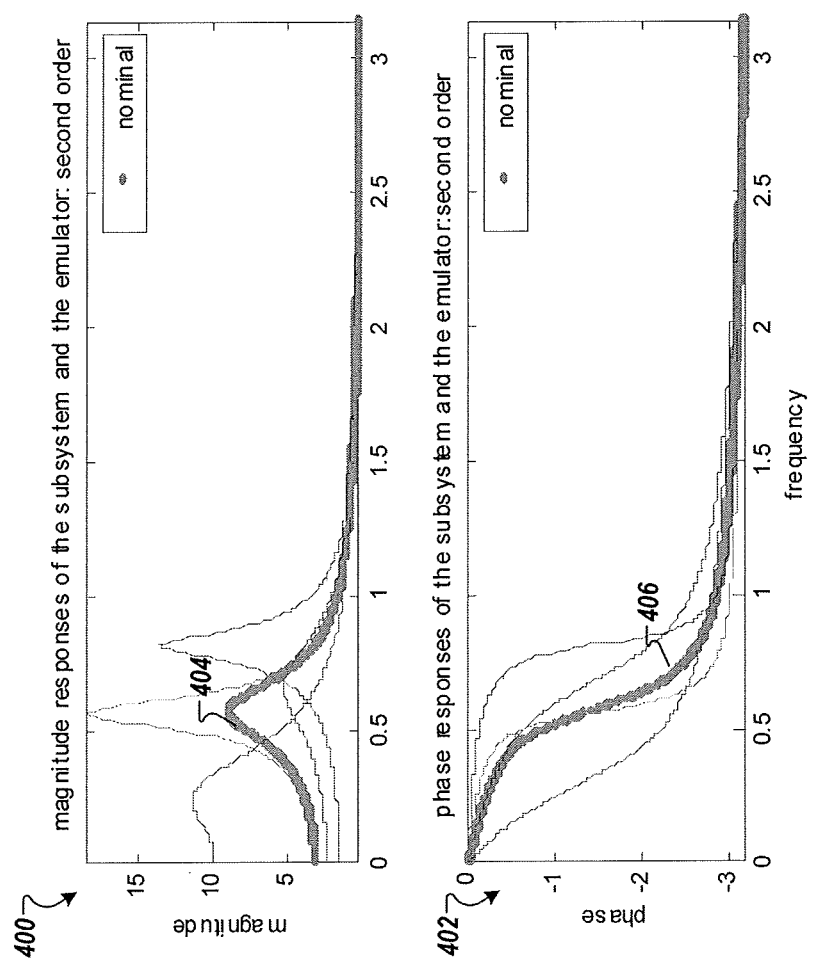
FIG. 4 is a schematic that shows gain and phase plots of the perturbed subsystem with a second order emulator according to one example.

FIG. 4 is a schematic that shows gain and phase plots of a perturbed subsystem with a second-order emulator according to one example. Graph 400 shows magnitude responses of the subsystem with the second-order emulator. Graph 402 shows phase responses of the subsystem with the second-order emulator. Trace 404 is the magnitude of the frequency response of the nominal unperturbed transfer function $G_{0j}(z)$. Trace 406 is the phase of the frequency response of the nominal unperturbed transfer function $G_{0j}(z)$. The frequency responses (magnitude and phase) of the perturbed subsystem G(z) are shown as the parameters of the emulators are varied. In graphs 400 and 402 the perturbation parameters are varied from 0 to $\pi$.

A variation in the operating point results when there is a variation $\Delta\gamma_i$ in a diagnostic parameter $\gamma_i$ from its nominal value $\gamma_i^0$, that may be expressed as:

$$\gamma_i = \gamma_i^0 + \Delta\gamma_i \tag{6}$$

Given the facts that a) emulators are used only at the input and output stages, and b) they each involve $n_{E_j}$ blocks with 2 elements ($\gamma_i$ and $\gamma_{n_{E_i}}$), the total number of diagnostic parameters q related to the number of inputs $n_r$ and outputs $n_y$ may be written as:

$$q \leq 2(n_r + n_y)\sum_j n_{E_j} + n_{acs} \tag{7}$$

where $n_{acs}$ is the number of directly accessible parameters such as the controller parameters.

The overall system G(z) relating the input r(k), and the output y(k) may be expressed using a linear regression model given by:

$$y(k) = \psi^T(k)\theta(\xi,\gamma) + v(k) \tag{8}$$

where $\psi(k)$ is an (Mx1) vector, with $M = n_a + n_b$, that may be written as:

$$\psi^T(k) = [-y(k-1) -y(k-2) \ldots -y(k-n_a) r(k-1) r(k-2) \ldots r(k-n_b)]$$

and the vector $\theta(\xi,\gamma)$ is an (Mx1) feature vector which is a function of the scheduling variable $\xi$ and the diagnostic parameter $\gamma$, that may be written as:

$$\theta(\xi,\gamma) = [a_i(\xi,\gamma) a_2(\xi,\gamma) \ldots a_{n_a}(\xi,\gamma) b_1(\xi,\gamma) b_2(\xi,\gamma) \ldots b_{n_b}(\xi,\gamma)]^T$$

where $\{a_i(\xi,\gamma)\}$ and $b_i(\xi,\gamma)$ are the denominator and the numerator coefficients of the overall system transfer function $G(\xi,\gamma)$.

The scheduling variables are measured in real time and may be selected so that they can track the variations in the dynamics of the system. The scheduling variables include exogenous signals such as the set point, internal variables such as the velocity and power, environment variables such as the altitude, temperature, pressure and air speed. The feature vector $\theta$ may be some nonlinear function of the scheduling parameter $\xi$ and the diagnostic parameter $\gamma$, and may be expressed as:

$$\theta(\xi) = \phi(\xi,\gamma) \tag{9}$$

where $\phi(\xi,\gamma)$ is some (Mx1) nonlinear function. In one example, the scheduling vector parameter $\xi = [\xi_1 \ \xi_2 \ \xi_3 \cdot \xi_p]^T$ and diagnostic vector parameter $\gamma = [\gamma_1 \ \gamma_2 \ \gamma_3 \cdot \gamma_q]^T$ may be a (px1) and (qx1) vector, respectively.

The nonlinear function $\theta = \phi(\xi,\gamma)$ takes the form of a truncated power series in the deviation of the diagnostic parameters. Specifically, the nonlinear function $\phi(\xi,\gamma)$ relating the feature vector $\theta(\xi)$ and the diagnostic parameter $\gamma$ can be expressed as a power series in $\{\Delta\gamma_i\}$ with a finite number of terms as given below:

$$\theta(\xi,\gamma) = \tag{10}$$
$$\theta^0(\xi) + \sum_i \Omega_i(\xi)\Delta\gamma_i + \sum_{i,j} \Omega_{ij}(\xi)\Delta\gamma_i\Delta\gamma_j + \sum_{i,j,k} \Omega_{ijk}(\xi)\Delta\gamma_i\Delta\gamma_j\Delta\gamma_k +$$
$$\ldots + \sum_{1,2,3,\ldots,q} \Omega_{1,2,3\ldots q}(\xi)\Delta\gamma_1\Delta\gamma_2\Delta\gamma_3 \ldots \Delta\gamma_q$$

where $\theta^0(\xi)$ is the nominal fault-free feature vector corresponding to the diagnostic parameter values $\gamma^0$, $\Omega_i(\xi)$, $\Omega_{ij}(\xi)$, $\Omega_{ijk}(\xi)$, ..., $\Omega_{123\ldots q}(\xi)$ are (Mx1) vectors which denote the first, second, third and up to $q^{th}$ partial derivatives of $\theta$ with respect to $\gamma$ as given by, $$\Omega_i(\xi) = \frac{\partial\theta}{\partial\gamma_i}, \ \Omega_{ij}(\xi) = \frac{\partial^2\theta}{\partial\gamma_i\partial\gamma_j}, \ \Omega_{ijk}(\xi) = \frac{\partial^3\theta}{\partial\gamma_i\partial\gamma_j\partial\gamma_k}, \tag{11}$$
$$\Omega_{123\ldots q}(\xi) = \frac{\partial^q\theta}{\partial\gamma_1\partial\gamma_2\partial\gamma_3 \ldots \partial\gamma_q}$$

The nominal feature vector and all the partial derivatives are calculated at the scheduling variable $\xi$. The partial derivative terms $\{\Omega_i(\xi), \Omega_{ij}(\xi), \Omega_{ijk}(\xi), \ldots \Omega_{123\ldots q}(\xi)\}$, which are the Jacobian of the feature vector with respect to the diagnostic parameters, referred to as influence vectors, at the operating condition determined by the scheduling variable $\xi$. The influence vectors express the influence of the effect of parameter variation on the feature vector. The power series expansion terms include products of the deviations $\{\Delta\gamma_i\}$ taken one-at-a-time, two-at-a-time and so on, up to q-at-a-time and the number of terms in the series is finite. Substituting for the power series expression for the feature vector in the linear regression model yields:

$$y(k) = \psi^T(k)\left(\theta^0(\xi) + \sum_i \Omega_i(\xi)\Delta\gamma_i + \right. \tag{12}$$

$$\sum_{i,j} \Omega_{ij}(\xi)\Delta\gamma_i\Delta\gamma_j + \sum_{i,j,k} \Omega_{ijk}(\xi)\Delta\gamma_i\Delta\gamma_j\Delta\gamma_k + \ldots +$$

$$\left. \sum_{1,2,3,\ldots,q} \Omega_{1,2,3\ldots q}(\xi)\Delta\gamma_1\Delta\gamma_2\Delta\gamma_3 \ldots \Delta\gamma_q \right) + \nu(k)$$

The linear regression model expressed by equation (1) is also termed diagnostic model. The diagnostic model is more general than the traditional one as it includes products of the deviations in the diagnostic parameters. Hence, the diagnostic model has a wider applications (compared to the traditional LPV models which are linear in the diagnostic parameters) and therefore can encompass applications requiring fault diagnosis of systems where one or more components may be faulty at the same time.

The LPV model is completely characterized by the partial derivative terms $\{\Omega_i, \Omega_{ij}, \Omega_{ijk}, \ldots\}$ wherein $\Omega_i$ models effect of the parameter variation $\Delta\gamma_i$ on the output y, $\Omega_{ij}$ models effect of the dual parameter variation $\Delta\gamma_i\Delta\gamma_j$ on the output y, $\Omega_{ijk}$ models effect of the triple parameter variation $\Delta\gamma_i\Delta\gamma_j\Delta\gamma_k$ on the output y, and so on up the q-tuple parameter variation $\Delta\gamma_i\Delta\gamma j \ldots \Delta\gamma_q$ on the output y.

In those cases where the structure of a mathematical model rarely agrees in full with that of the physical system, then the dimension of θ is known and is the number of terms in the set $\Omega=\{\Omega_i, \Omega_{ij}, \Omega_{ijk}, \ldots \Omega_{123\ldots q}\}$. In this case, only the relevant partial derivative terms need to be estimated, thus speeding up the procedure.

Equation (12) shows that, although the input-output model may appear linear, it is actually nonlinear in the diagnostic parameter. The nonlinearity is of a soft type, referred to as multi-linear, making the model separately linear in each of the diagnostic parameter $\gamma_i$ when all other diagnostic parameters $\gamma_j$: $j\neq i$ are treated as constants. Note that equation (12) is not a Taylor series expansion in $\{\gamma_i\}$, since only a finite number of terms in the expansion is required to accurately model the output.

To illustrate the capabilities of the system and methodologies described herein, exemplary results are presented.

The mathematical model of a system derived from physical laws of third order may be expressed as $$G(z,\xi) = \frac{b_1(\xi)z^{-1} + b_2(\xi)z^{-2} + b_3(\xi)z^{-3}}{1 + a_1(\xi)z^{-1} + a_2(\xi)z^{-2} + a_3(\xi)z^{-3} + a_4(\xi)z^{-4}} \quad (13)$$

where $b_1 = k_A k_1 k_\theta k_2 k_p \gamma_1 \gamma_4 \gamma_2$ $b_2 = k_A k_1 k_\theta k_2 \gamma_1 \gamma_4 (k_p + \gamma_2(k_I - k_p))$ $b_3 = k_A k_1 k_2 k_\theta \gamma_1 \gamma_4 (k_I - k_p)$ $a_1 = k_A k_1 k_\theta k_2 k_p \gamma_1 \gamma_4 \gamma_2 + k_\omega k_d k_A k_1 \gamma_1 \gamma_2 \gamma_3 - \alpha + \gamma_2 - 2,$ $a_2 = k_A k_1 k_\theta k_2 \gamma_1 \gamma_4 (k_p + \gamma_2(k_I - k_p)) + k_\omega k_d k_A k_1 \gamma_1 \gamma_3 -$ $\alpha\gamma_2 - 2(k_\omega k_d k_A k_1 \gamma_1 \gamma_2 \gamma_3 - \alpha + \gamma_2) + 1$ $a_3 = k_A k_1 k_\theta k_2 \gamma_1 \gamma_4 (k_I - k_p) - 2k_\omega k_d k_A k_1 \gamma_1 \gamma_3 - 2\alpha\gamma_2 +$ $k_\omega k_d k_A k_1 \gamma_1 \gamma_2 \gamma_3 - \alpha + \gamma_2$ The explicit dependence on the scheduling variable of the system parameters, the influence vectors, and the feature vector is not indicated for brevity.

Figure 5:
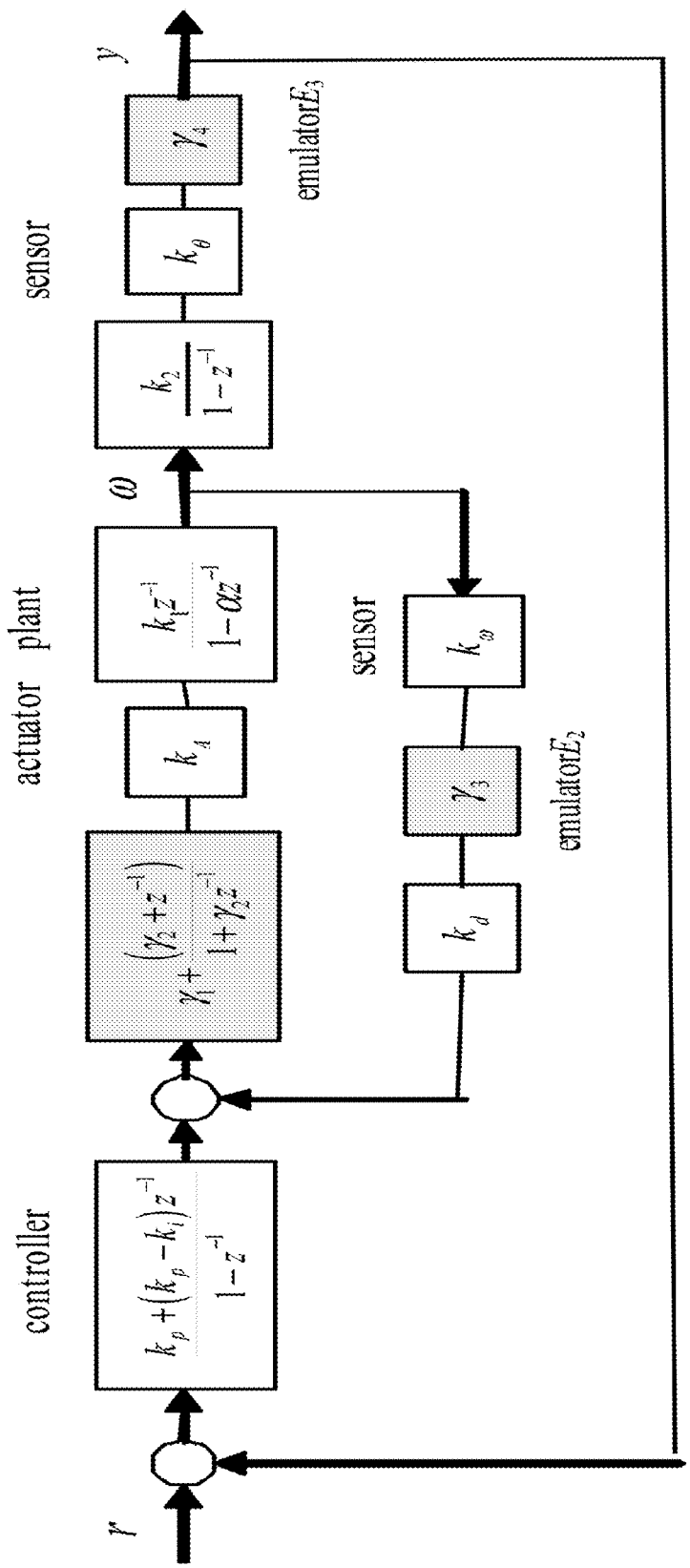
FIG. 5 is a schematic that shows an exemplary position control system according to one example.

FIG. 5 is a schematic that shows an exemplary position control system according to one example. FIG. 5 shows a position control system formed of a) a PID (proportional integral derivative) controller with gains $k_p$, $k_1$ and $k_d$, b) an actuator which is an amplifier of gain $k_A$, c) position sensor of gain $k_\theta$, d) velocity sensor of gain $k_\omega$, an a plant which is a DC motor with gain $k_1$ and time constant α and gear ratio $k_2$.

The nominal values of $k_A$, $k_\omega$ and $k_\theta$ are unity. Emulators $E_1$, $E_2$ and $E_3$ are connected to the input of the amplifier, the output of the position velocity, and the output of position sensor, respectively. Emulator $E_1$ simulates variations in the gain and phase of the actuator and the plant. Emulator $E_1$ is an allpass filter expressed by:

$$E_1(z) = \gamma_1 + \frac{\gamma_3(\gamma_2 + z^{-1})}{1 + \gamma_2 z^{-1}} \quad (14)$$

Emulators $E_2$ and $E_3$ simulate variations in the velocity sensor and position sensor, as may be expressed by equation (15) and equation (16), respectively:

$$E_2(Z) = \gamma_4 \quad (15)$$

$$E_3(z) = \gamma_5 \quad (16)$$

The diagnostic parameters $\gamma=[\gamma_1\ \gamma_2\ \gamma_3\ \gamma_4]^T$ simulate variations in the system during the identification stage, and are estimated during the operational stage to monitor the fault status of the system.

Emulator $E_1(z)$ captures the behavior of the actuator and the plant, that is the gain and phase changes due to variations in $k_A k_1$ and the plant time constant α are captured by $\gamma_1$ and $\gamma_2$, respectively:

$$\left(\frac{k_A^0 k_1^0}{1 - \alpha^0 z^{-1}}\right)\left(\gamma_0 + \frac{\gamma_1(\gamma_2 + z^{-1})}{1 + \gamma_2 z^{-1}}\right) \text{ emulates } \frac{k_A k_1}{1 - \alpha z^{-1}}$$

wherein emulator $E_2(z)$ captures the behavior of velocity sensor $k_\omega^0 \gamma_3$ emulates $k_\omega$, and emulator $E_3(z)$ captures the behavior of position sensor $k_\theta^0 \gamma_4$ emulates $k_\theta$, and where $k_A^0$, $k_1^0$, $\alpha^0$, $k_\omega^0$, $k_\theta^0$ are the nominal parameter values.

A variation in the subsystem $G_j$ should only affect the parameters of the emulator $E_j$ (which emulates the faults in the subsystem $G_j$) to determine which of the subsystem has varied. Let the variations in the parameters of the actuator, the plant, the velocity sensor and the position sensor be respectively $\Delta k_A$, $\Delta\alpha$, $\Delta k_\omega$, and $\Delta k_\theta$. Then the following 4 conditions should hold: $\Delta k_A$, $\Delta \alpha$, $\Delta k_\omega$, and $\Delta k_\theta$ should each affect only $\Delta \gamma_1$, $\Delta \gamma_2$, $\Delta \gamma_3$ and $\Delta \gamma_4$, respectively.

When the structure of a mathematical model and that of the physical system are the same, the expressions for the feature and influence vectors in terms of the parameters of the subsystems and the emulators are known. The feature vector $\theta$ is a 7×1 vector derived from the expressions of the numerator and denominator polynomials of the transfer function $T(z)$, and may be written as $$\theta = \begin{bmatrix} a_1 \\ a_2 \\ a_3 \\ a_4 \\ b_1 \\ b_2 \\ b_3 \end{bmatrix} = \begin{bmatrix} k_A k_1 k_\theta k_2 k_p \gamma_1 \gamma_4 \gamma_2 + k_d k_\omega k_A k_1 \gamma_1 \gamma_2 \gamma_3 - \alpha + \gamma_2 - 2 \\ k_A k_1 k_\theta k_2 \gamma_1 \gamma_4 (k_p + \gamma_2(k_l - k_p)) + k_d k_\omega k_1 \gamma_1 \gamma_3 - \\ \alpha \gamma_2 - 2(k_d k_\omega k_A k_1 \gamma_1 \gamma_2 \gamma_3 - \alpha + \gamma_2) + 1 \\ k_A k_1 k_\theta k_2 \gamma_1 \gamma_4 (k_l - k_p) - 2 k_d k_\omega k_A k_1 \gamma_1 \gamma_3 - 2\alpha\gamma_2 + \\ k_d k_\omega k_A k_1 \gamma_1 \gamma_2 \gamma_3 - \alpha + \gamma_2 \\ k_d k_\omega k_A k_1 \gamma_1 \gamma_3 - \alpha \gamma_2 \\ k_1 k_A k_2 k_p \gamma_1 \gamma_4 \gamma_2 \\ k_1 k_A k_\theta k_2 \gamma_1 \gamma_4 (k_p + \gamma_2(k_l - k_p)) \\ k_1 k_A k_\theta k_2 \gamma_1 \gamma_4 (k_l - k_p) \end{bmatrix} \quad (17)$$

The nonlinear function $\phi(\xi, \gamma)$ given in equation (9) is multi-linear in $\gamma$, i.e. it is a function of monomials of the elements of $\gamma$, namely $\gamma_2$, $\gamma_1\gamma_3$, $\gamma_1\gamma_4$, $\gamma_1\gamma_2\gamma_3$ and $\gamma_1\gamma_2\gamma_4$.

The influence vectors may be determined by the CPU 900. The influence vector $$\Omega_i = \frac{\partial \theta}{\partial \gamma_i}$$

is derived from the expression of $\theta$ by first identifying all the terms that contain $\gamma_i$ and setting them to unity. Other terms $\gamma_j$: $j \neq i$ are set to their initial values $\gamma_j^0$.

$$\Omega_{ij} = \frac{\partial^2 \theta}{\partial \gamma_i \partial \gamma_j} = \frac{\partial \Omega_i}{\partial \gamma_j}$$

is calculated by identifying in the expression for $\Omega_i$ all the terms containing $\gamma_j$ and setting $\gamma_j=1$ and the rest to their initial values, $$\Omega_{ijk} = \frac{\partial^3 \theta}{\partial \gamma_i \partial \gamma_j \partial \gamma_k} = \frac{\partial \Omega_{ij}}{\partial \gamma_k},$$

is obtained by setting $\gamma_k=1$ in the expression for $\Omega_{ij}$, and the rest to their initial values, and so on till and so on till $$\Omega_{ik\ldots m} = \frac{\partial^m \theta}{\partial \gamma_i \partial \gamma_j \partial \gamma_k \ldots \partial \gamma_m}$$

is a constant (does not contain any term in $\{\gamma_i\}$).

Hence, the influence vectors may be restricted to the set $\Omega = \{\Omega_1, \Omega_2, \Omega_3\Omega_4, \Omega_{12}\Omega_{13}, \Omega_{14}, \Omega_{23}\Omega_{24}, \Omega_{123}, \Omega_{124}\}$ whose elements are given by $$\Omega_1 = \begin{bmatrix} k_1 k_2 k_\theta k_p \gamma_2^0 \gamma_4^0 + k_d k_1 \gamma_1^0 \gamma_3^0 \\ k_1 k_2 k_\theta k_p \gamma_4^0 (k_p + \gamma_2^0(k_l - k_p)) + k_d k_1 \gamma_3^0 - 2k_d k_1 \gamma_2^0 \gamma_3^0 \\ k_1 k_2 k_\theta \gamma_4^0 (k_l - k_p) - 2k_d k_1 \gamma_3^0 + k_d k_1 \gamma_2^0 \gamma_3^0 \\ k_d k_1 \gamma_3^0 \\ k_1 k_2 k_\theta k_p \gamma_2^0 \gamma_4^0 \\ k_1 k_2 k_\theta \gamma_4^0 (k_p + \gamma_2^0(k_l - k_p)) \\ k_1 k_2 k_\theta \gamma_4^0 (k_l - k_p) \end{bmatrix}, \quad (18)$$

$$\Omega_2 = \begin{bmatrix} k_1 k_2 k_\theta k_p \gamma_1^0 \gamma_4^0 + k_d k_\omega k_1 \gamma_1^0 \gamma_3^0 + 1 \\ k_1 k_2 k_\theta \gamma_1^0 \gamma_4^0 (k_l - k_p) - \alpha - 2 - 2 k_d k_\omega k_1 \gamma_1^0 \gamma_3^0 \\ -2\alpha + k_d k_\omega k_1 \gamma_1^0 \gamma_3^0 + 1 \\ -\alpha \\ k_1 k_2 k_\theta k_p \gamma_1^0 \gamma_4^0 \\ k_1 k_2 k_\theta \gamma_1^0 \gamma_4^0 (k_l - k_p) \\ 0 \end{bmatrix}$$

$$\Omega_3 = \begin{bmatrix} k_d k_\omega k_1 \gamma_1^0 \gamma_2^0 \\ k_d k_\omega k_1 \gamma_1^0 - 2k_d k_\omega k_1 \gamma_1^0 \gamma_2^0 \\ k_d k_\omega k_1 \gamma_1^0 + k_d k_\omega k_1 \gamma_1^0 \gamma_2^0 \\ k_d k_\omega k_1 \gamma_1^0 \\ 0 \\ 0 \\ 0 \end{bmatrix},$$

$$\Omega_4 = \begin{bmatrix} k_1 k_2 k_\theta k_p \gamma_2^0 \gamma_2^0 \\ k_1 k_2 k_\theta k_p \gamma_1^0 (k_p + \gamma_2^0(k_l - k_p)) \\ k_1 k_2 k_\theta \gamma_1^0 (k_l - k_p) \\ 0 \\ k_1 k_2 k_\theta k_p \gamma_1^0 \gamma_2^0 \\ k_1 k_2 k_\theta \gamma_1^0 (k_p + \gamma_2^0(k_l - k_p)) \\ k_1 k_2 k_\theta \gamma_1^0 (k_l - k_p) \end{bmatrix},$$

$$\Omega_{13} = \begin{bmatrix} k_d k_\omega k_1 \gamma_2^0 \\ k_d k_\omega k_1 - 2 k_d k_\omega k_1 \gamma_2^0 \\ -2 k_d k_\omega k_1 + k_d k_\omega k_1 \gamma_2^0 \\ k_d k_\omega k_1 \\ 0 \\ 0 \\ 0 \end{bmatrix}$$

$$\Omega_{14} = \begin{bmatrix} k_1 k_2 k_\theta k_p \gamma_2^0 \\ k_1 k_2 k_\theta (k_p + \gamma_2^0(k_l - k_p)) \\ k_1 k_2 k_\theta (k_l - k_p) \\ 0 \\ k_1 k_2 k_\theta k_p \gamma_2^0 \\ k_1 k_2 k_\theta (k_p + \gamma_2^0(k_l - k_p)) \\ k_1 k_2 k_\theta (k_l - k_p) \end{bmatrix}, \quad (19)$$

$$\Omega_{123} = \begin{bmatrix} k_d k_\omega k_1 \\ -2k_d k_\omega k_1 \\ k_d k_\omega k_1 \\ 0 \\ 0 \\ 0 \\ 0 \end{bmatrix}, \quad \Omega_{124} = \begin{bmatrix} k_1 k_2 k_\theta k_p \\ k_1 k_2 k_\theta (k_l - k_p) \\ 0 \\ 0 \\ k_1 k_2 k_\theta k_p \\ k_1 k_2 k_\theta (k_l - k_p) \\ 0 \end{bmatrix}$$

$$\Omega_{12} = \begin{bmatrix} k_1 k_2 k_\theta k_p \gamma_2^0 \\ k_1 k_2 k_\theta k_p \gamma_4^0 (k_l - k_p) - 2k_d k_1 \gamma_3^0 \\ k_d k_1 \gamma_3^0 \\ 0 \\ k_1 k_2 k_\theta k_p \gamma_4^0 \\ k_1 k_2 k_\theta \gamma_4^0 (k_l - k_p) \\ 0 \end{bmatrix}, \quad (20)$$

$$\Omega_{23} = \begin{bmatrix} k_d k_\omega k_1 \gamma_1^0 \\ -2k_d k_\omega k_1 \gamma_3^0 \\ k_d k_\omega k_1 \gamma_1^0 \\ 0 \\ 0 \\ 0 \\ 0 \end{bmatrix}; \quad \Omega_{24} = \begin{bmatrix} k_1 k_2 k_\theta k_p \gamma_1^0 \\ k_1 k_2 k_\theta \gamma_1^0 (k_l - k_p) \\ 0 \\ 0 \\ k_1 k_2 k_\theta k_p \gamma_4^0 \\ k_1 k_2 k_\theta \gamma_1^0 (k_l - k_p) \\ 0 \end{bmatrix}$$

The LPV model may be written as $$y(k) = \psi^T(k)(\theta^0 + \Omega_1 \Delta \gamma_2 + \Omega_2 \Delta \gamma_2 + \Omega_3 \Delta \gamma_3 + \Omega_4 \Delta \gamma_4 + \\ \Omega_{12} \Delta \gamma_1 \Delta \gamma_2 + \Omega_{13} \Delta \gamma_1 \Delta \gamma_3 + \Omega_{14} \Delta \gamma_1 \Delta \gamma_4 + \Omega_{23} \Delta \gamma_2 \Delta \gamma_3 + \\ \Omega_{24} \Delta \gamma_2 \Delta \gamma_4 + \Omega_{13} \Delta \gamma_1 \Delta \gamma_2 \Delta \gamma_3 + \Omega_{124} \Delta \gamma_1 \Delta \gamma_2 \Delta \gamma_4) + \\ v(k) \quad (21)$$

Each influence vector captures variations in a diagnostic parameter characterizing one subsystem so that the variation in the feature vector $(\theta - \theta^0)$ is linearly related to the diagnostic parameter that characterizes that subsystem.

The model of the system varies as a result of variations in the operating regime which is tracked by the scheduling variable $\xi$. An adaptive scheme for the feature vector $\theta$, and the influence vectors $\{\Omega_i\}, \{\Omega_{ij}\}, \{\Omega_{ijk}\}, \ldots, \{\Omega_{i\ldots q}\}$ is determined as a function of the scheduling variable.

The LPV model, which may be characterized by the feature vector and the influence vectors, is a nonlinear function of the scheduling parameters. Considering polytopic LPV systems where the feature vector $\theta(\xi, \gamma)$ is affine in the scheduling variable $\xi(k)$ The feature vector varies within a polytope $\Theta$ of vertices $\{\xi^i\}$, that is $\xi \in \Theta$, satisfying the following condition:

$$\Theta = \sum_{i=1}^{n_p} \kappa_i \xi^i \text{ where} \quad (22)$$

$$\sum_{i=1}^{n_p} \kappa_i = 1 \text{ and } \kappa_i \geq 0.$$

The feature vector $\theta(\xi, \gamma)$ may be expressed as a function of the scheduling variable $\xi(k)$ as $$\theta(\xi) = \theta(\xi_0) + \sum_{l=1}^{p} \Gamma_{il}(\xi_l - \xi_{0l}) \quad (23)$$

where $$\Gamma_{0l} = \frac{\delta \theta(\xi_l)}{\delta \xi_l}$$

is the Mx1 vector of the partial derivative of $\theta$ with respect to $\xi_i$.

Equation (24) may be expressed in the following vector-matrix form:

$$\theta(\xi) = Q_0(\xi) \rho(\xi) \quad (24)$$

where $Q_0$ is a Mx(p+1) matrix formed of columns representing the nominal feature vector and the partial derivatives of the feature vector with respect to the scheduling variable, and $\rho$ is a (p+1)x1 vector formed of unity and the deviations of scheduling variables from their nominal values, as shown below:

$$Q_0(\xi) = [\theta(\xi_0) \, \Gamma_{01} \, \Gamma_{02} \, \Gamma_{03} \ldots \Gamma_{04}] \quad (25)$$

$$\rho = [1 \, \rho_1 \, \rho_2 \, \rho_3 \cdot p_p]^T = [1 (\xi_1 - \xi_{01})(\xi_2 - \xi_{02})(\xi_3 - \xi_{03}) \ldots \\ (\xi_p - \xi_{0p})]^T \quad (26)$$

The columns of $Q_0$, namely $\theta(\xi_0)$ and $\{\Gamma_{0i}\}$, may be estimated offline by performing a number of experiments $N_e$ by varying the scheduling variable in the neighborhood of the nominal value $\xi_0$ within the polytope $\xi \in \Theta$. That is, the CPU 900 may vary automatically the scheduling variable within a predetermined range around the nominal value.

Each of the influence vectors may be expressed as an affine function of the scheduling variable given by:

$$\Omega_i(\xi) = \Omega_i(\xi_0) + \sum_{l=1}^{p} \Gamma_{il}(\xi_l - \xi_{0l}) \quad (27)$$

where $$\Gamma_{il} = \frac{\delta \Omega_i(\xi_l)}{\delta \xi_l}$$

is the Mx1 vector of the partial derivatives of $\Omega$ with respect to $\xi$.

Equation (28) may be expressed in a vector-matrix form as:

$$\Omega_i(\xi) = Q_i(\xi) \rho(\xi) \quad (28)$$

where $Q_i$ is a Mx(p+1) matrix formed of the columns representing the nominal influence vector and the partial derivatives of the influence vector with respect to the scheduling variable $\xi$:

$$Q_i(\xi) = [\Omega_i(\xi_0) \Gamma_{1i}(\xi) \Gamma_{2i}(\xi) \Gamma_{3i}(\xi) \ldots \Gamma_{pi}(\xi)] \quad (29)$$

Consider the influence vector $\Omega_{ij}$ expressed as:

$$\Omega_{ij}(\xi) = \Omega_{ij}(\xi_0) + \sum_{l=1}^{p} \Gamma_{ijl}(\xi_l - \xi_{0l}) \quad (30)$$

where $$\Gamma_{ijl} = \frac{\delta \Omega_{ij}(\xi)}{\delta \xi_l}$$

is the Mx1 vector of the partial derivative of $\Omega_{ij}$ with respect to $\xi_l$. Expressing equation (31) in a vector-matrix form gives:

$$\Omega_{ij}(\xi) = Q_{ij}(\xi)\rho(\xi) \quad (31)$$

where $Q_{ij}$ is an Mx(p+1) matrix of columns representing the nominal influence vector and its partial derivatives with respect to the scheduling variable $\xi$ and of the coefficient vectors:

$$Q_{ij}(\xi) = [\Omega_{ij}(\xi_0)\Gamma_{1ij}(\xi)\Gamma_{2ij}(\xi)\Gamma_{3ij}(\xi) \ldots \Gamma_{pij}(\xi)] \quad (32)$$

Note that $Q_{ijk}, \ldots, Q_{123\ldots q}$, corresponding to $\Omega_{ijk}, \ldots, \Omega_{123\ldots q}$, may be defined in a similar fashion.

Thus the feature vector may be expressed in terms of the scheduling parameter and the diagnostic parameters as:

$$\theta(\xi) = Q_0(\xi)\rho(\xi) + \sum_i Q_i(\xi)\rho(\xi)\Delta\gamma_i + \\ \sum_{i,j} Q_{ij}(\xi)\rho(\xi)\Delta\gamma_i\Delta\gamma_j + \sum_{i,j,k} Q_{ijk}(\xi)\rho(\xi)\Delta\gamma_i\Delta\gamma_j\Delta\gamma_k + \\ \sum_{1,2,3,\ldots q} Q_{123\ldots q}(\xi)\rho(\xi)\Delta\gamma_1\Delta\gamma_2\Delta\gamma_3\ldots\Delta\gamma_q \quad (33)$$

Thus, the LPV model given by equation (21) may be expressed as:

$$y(k) = \psi^T(k)\Bigg(Q_0(\xi)\rho(\xi) + \sum_i Q_i(\xi)\rho(\xi)\Delta\gamma_i + \\ \sum_{i,j} Q_{ij}(\xi)\rho(\xi)\Delta\gamma_i\Delta\gamma_j + \sum_{i,j,k} Q_{ijk}(\xi)\rho(\xi)\Delta\gamma_i\Delta\gamma_j\Delta\gamma_k + \\ \sum_{1,2,3,\ldots q} Q_{123\ldots q}(\xi)\rho(\xi)\Delta\gamma_1\Delta\gamma_2\Delta\gamma_3\ldots\Delta\gamma_q\Bigg) + v(k) \quad (34)$$

The LPV model of equation (34) tracks the variation in the dynamic model along the trajectory of the scheduling variable $\xi(k)\in\Theta$. The LPV model is characterized by the matrices $Q_0, Q_i, Q_{ij}, Q_{ijk}, \ldots, Q_{123\ldots q}$ associated with the nominal feature vectors and its partial derivatives with respect to diagnostic parameters.

The LPV model may be identified as it varies along the trajectories of $\xi(k)$ by performing a number of experiments and collecting N input-output pairs of data samples for each experiment.

In the case where the structure of a mathematical model agrees very well with that of the physical system, then the dimension of B is known and the specific influence vectors from the set $\Omega = \{\Omega_i, \Omega_{ij}, \Omega_{ijk}, \ldots \Omega_{123\ldots q}\}$ that needs to be identified. Described herein is an exemplary system where the structure and members of the set $\Omega$ are both unknown, i.e., both the dimension of $\theta$ and the elements of $\Omega$ are unknown. The criterion for identifying $\Omega$ is that the mean-squared error between the system output, y(k), and the diagnostic model output, $\hat{y}(k)$, be less than a predetermined value s for all perturbations of $\Delta\gamma$ in a predetermined range, $\delta$, $$\min_Q \{\|y(k) - \hat{y}(k)\|_2\} \le \varepsilon \forall \ \|\Delta\gamma\| \le \delta \quad (35)$$

In one embodiment, when the methodologies described herein are used for fault diagnosis, it is crucial that the influence of the diagnostic parameters on the output be captured reliably. When the functional relationship governing the feature vector and the diagnostic parameters is not known, such as equation (17), because the structure of the identified model may not be equal that of the physical model derived from the physical laws, for example the model derived from physical laws given by (13). In order to capture accurately the map $\theta = \phi(\xi,\gamma)$, a number of parameter-perturbed experiments are performed by the CPU 900 offline on the actual system.

To identify the feature vector $\theta$ and the influence vectors $\Omega$, a series of $N_{ij}$ experiments is conducted that involves perturbing the diagnostic parameters of each emulator (associated with a subsystem) with an input excitation that takes on different amplitudes and spectral content. If no product terms are to be considered, then the parameters need to be perturbed one-at-time.

If product terms are to be considered such as a double product, $\gamma_i\gamma_j$ or a triple product, $\gamma_i\gamma_j\gamma_k$, etc., then two parameters $\gamma_i$ and $\gamma_j$ or three parameters $\gamma_i$, $\gamma_j$ and $\gamma_k$, need to be perturbed. For each experiment, an input-output data pair $\{y(k-i)\ r(k-i)\}, i=0, 1, 2, \ldots N-1$, is collected. The distinct input-output models that govern the effect of i) only perturbing one parameter at a time, $\Delta\gamma_i$, ii) only perturbing two parameters at a time, $\Delta\gamma_i\gamma_j$, iii) only perturbing three parameters at a time, $\Delta\gamma_i\gamma_j\gamma_k$, and so on until all q parameters have been obtained. Using the LPV model given by equation (34), the model can be expressed in a recursive form so as to explicitly relate the unknown matrices $Q_0\ Q_i,\ Q_{ij}, Q_{ijk}, \ldots, Q_{123\ldots q}$ on the right hand side of equation (34):

$$y^0(k) = \psi_0^T(k)Q_0(\xi)\rho(\xi) + v(k) \quad (36)$$

$$y^i(k) - \psi_i^T(k)Q_0\rho(k) = \psi_i^T(k)Q_i(\xi)\rho(\xi)\Delta\gamma_i + v(k) \quad (37)$$

$$y^{ij}(k) - \psi_{ij}^T(k)(Q_0 + Q_i(\xi)\Delta\gamma_i + Q_j(\xi)\Delta\gamma_j)\rho(\xi) = \psi_{ij}^T(k)Q_{ij}(\xi)\rho(\xi)\Delta\gamma_i\Delta\gamma_j + v(k) \quad (38)$$

$$y^{ijk}(k) - \psi_{ijk}^T(k)(Q_0(\xi) + Q_i(\xi)\Delta\gamma_i + Q_j(\xi)\Delta\gamma_j + Q_k(\xi)\rho(\xi)\Delta\gamma_k + Q_{ij}(\xi)\rho(\xi)\Delta\gamma_i\Delta\gamma_j)\rho(\xi) = \psi_{ijk}^T(k)Q_{ijk}(\xi)\rho(\xi)\Delta\gamma_i\Delta\gamma_j\Delta\gamma_k + v(k) \quad (39)$$

$$y^{123\ldots q}(k) - \psi_{123\ldots q}^T(k) \quad (40)$$

$$\left(Q_0 + \sum_i Q_i\Delta\gamma_i + \sum_{ij} Q_{ij}\Delta\gamma_i\Delta\gamma_j + \sum_{ijk} Q_{ijk}\Delta\gamma_i\Delta\gamma_j\Delta\gamma_k + \ldots\right) = \\ \psi_{123\ldots q}^T(k)Q_{123\ldots q}\Delta\gamma_i\Delta\gamma_j\Delta\gamma_k \ldots \Delta\gamma_q + v(k)$$

where $y^0(k)$ denotes the Nx1 output vector and $\psi_0^T(k)$ is the Nx2L data matrix, $\{\gamma(k-i) \; \psi(k-i)\}$, i=0, 1, 2, ... N-1, correspond to the case of no perturbations (marked with the superscript "0"). Similarly $y^i(k)$, $\psi_i(k)$ and $\Omega_i$ represent: an Nx1 output vector, a NxM data matrix and a Mx1 matrix that corresponds to the case when the $i^{th}$ diagnostic parameter is perturbed. The terms, $y_{ij}(k)$, $\psi_{ij}(k)$ and $\Omega_{ij}$ corresponds to the case when both $\gamma_i$ and $\gamma_j$ are perturbed, and so on. v(k) is an Nx1 noise vector.

The unknown Mx(p+1)) matrices $Q_0$, $Q_i$, $Q_{ij}$, $Q_{ijk}$, ..., $Q_{123...q}$ are estimated recursively in the least squares sense using singular value decomposition (SVD). Each of the matrices is identified one at a time using a data stored in the memory 902 from each of $N_e$ experiments. First, $Q_0$ is estimated. Then using the estimate of $Q_0$, the matrix $Q_i$ is identified, using the previously identified values of $Q_0$ and $Q_i$, $Q_{ij}$ is identified, and so on until $\Omega_{123...q}$ is identified. Using a recursive scheme minimize the computationally burden.

At each stage of the least-squares estimation, the unknown matrices $Q_0$, $Q_i$, $Q_{ij}$, $Q_{ijk}$, ..., $Q_{123...q}$ are expressed in a vector form by concatenating their columns. For example, using equation (29):

$$x_{Qi} = [\Omega_i^T(\xi_0) \; \Gamma_{1i}^T(\xi) \; \Gamma_{2i}^T(\xi) \; \Gamma_{3i}^T(\xi) \ldots \Gamma_{pi}^T(\xi)]^T \quad (41)$$

where $x_{Qi}$ denotes a vector formed by concatenating the columns of the matrix $Q_i$.

The vectors $x_{Qi}$, $x_{Qij}$, $x_{Qijk}$, and $x_{Q_{123...q}}$ are similarly defined. After expressing equations (36)-(40) in a Kronecker product form, which relates the unknown matrices in a vector form to the data in the standard least-squares form, the estimates are then obtained.

Using $\text{vec}(AXB) = (B^T \otimes A)\text{vec}(X)$ where $\text{vec}(X)$ is a vector form obtained by concatenating the columns of the matrix X, then vectorizing the unknown matrix $Q_0$, equation (36) may be written as $$y^0(k) = (\rho(\xi) \otimes \psi_0^T(k)) x_{Q_0} + v(k) \quad (42)$$

where $\otimes$ denotes Kronecker product.

Using the SVD-based least-squares method, the estimates may be expressed as $$\hat{x}_{Q_0} = (\rho(\xi) \otimes \psi_0^T(k))^\dagger y^0(k) \quad (43)$$

Vectorizing the unknown matrix $Q_i$ and using the estimate $\hat{Q}_0$ of the unknown $Q_0$ from equation (43), equation (37) may be written as:

$$y^i(k) - \psi_i^T(k)\hat{Q}_0\rho(k) = (\rho(\xi) \otimes \psi_i^T(k)\Delta\gamma_i) x_{Qi} + v(k) \quad (44)$$

Using the SVD-based least-squares method, the estimates may be written as:

$$\hat{x}_{Qi} = (\rho(\xi) \otimes \psi_i^T(k)\Delta\gamma_i)^\dagger (y^i(k) - \psi_i^T(k)\hat{Q}_0\rho(k)) \quad (45)$$

Vectorizing the unknown matrix $Q_{ij}$ and using the estimates $\hat{Q}_0$, $\hat{Q}_i$, and $\hat{Q}_j$ of the unknown $Q_0$, $Q_i$, and $Q_j$, respectively, from equation (43) and equation (45), then equation (38) may be written as:

$$y^{ij}(k) - \psi_{ij}^T(k)(\hat{Q}_0(\xi) + \hat{Q}_i(\xi)\Delta\gamma_i + \hat{Q}_j(\xi)\Delta\gamma_j)\rho(\xi) = (\rho(\xi) \otimes \psi_{ij}^T(k)\Delta\gamma_i\Delta\gamma_j) x_{Qij} + v(k) \quad (46)$$

Using the SVD-based least-squares method, the estimates are given by:

$$\hat{x}_{Qij} = (\rho(\xi) \otimes \psi_{ij}^T(k)\Delta\gamma_i\Delta\gamma_j)^\dagger (y^{ij}(k) - \psi_{ij}^T(k)(\hat{Q}_0(\xi) + \hat{Q}_i(\xi)\Delta\gamma_i + \hat{Q}_j(\xi)\Delta\gamma_j)\rho(\xi)) \quad (47)$$

Vectorizing the unknown matrix $Q_{ijk}$ and using the estimates $\hat{Q}_0$, $\hat{Q}_i$, $\hat{Q}_j$ and $\hat{Q}_{ij}$ of the unknown $Q_0$, $Q_i$, $Q_j$ and $Q_{ij}$, respectively from equations (43), (45) and (47), then equation (39) may be written as:

$$y^{ijk}(k) - \psi_{ijk}^T(k)(\hat{Q}_0(\xi) + \hat{Q}_i(\xi)\Delta\gamma_i + \hat{Q}_j(\xi)\Delta\gamma_j + \hat{Q}_k(\xi)\rho(\xi)\Delta\gamma_k + \hat{Q}_{ij}(\xi)\rho(\xi)\Delta\gamma_i\Delta\gamma_j)\rho(\xi) = (\rho(\xi) \otimes \psi_{ijk}^T(k)\Delta\gamma_i\Delta\gamma_j\Delta\gamma_k) x_{Qijk} + v(k) \quad (48)$$

Using the SVD-based least-squares method, the estimates may be expressed as:

$$\hat{x}_{Qijk} = (\rho(\xi) \otimes \psi_{ijk}^T(k)\Delta\gamma_i\Delta\gamma_j\Delta\gamma_k)^\dagger (y^{ijk}(k) - \psi_{ijk}^T(k)(\hat{Q}_0 + \hat{Q}_i(\xi)\Delta\gamma_i + \hat{Q}_j(\xi)\Delta\gamma_j + \hat{Q}_k(\xi)\rho(\xi)\Delta\gamma_k + \hat{Q}_{ij}(\xi)\rho(\xi)\Delta\gamma_i\Delta\gamma_j)\rho(\xi)) \quad (49)$$

The rest of the matrices, $Q_{ijkl} \ldots Q_{123\ldots q}$ similarly estimated. From the estimates of $Q_0$, $Q_i$, $Q_{ij}$, $Q_{ijk}$, ..., $Q_{123...q}$, the feature vector and influence vectors at the nominal value of the scheduling parameter, i.e. $\theta(\xi^0)$, $\Omega_i(\xi^0)$ and $\Omega_{ij}(\xi^0)$, $\Omega_{ijk}(\xi^0)$, ..., $\Omega_{123...q}(\xi^0)$, as well at any values of the scheduling parameters may be determined using equations (24), (28), (31) and (33).

The Kalman filter (KF) is a closed-loop filter formed of an exact copy of the state-space model of the fault-free system and driven by the residual. That is, it contains an internal model of the fault-free system output driven by the error, termed residual, between the actual system output, which is fault-bearing, and the estimate of the fault-free output obtained from the KF. The structure of the KF is given by:

$$\hat{x}(k+1) = A_0(\xi)\hat{x}(k) + B_0(\xi)r(k) + K_0(\xi)(y(k) - C_0(\xi)(k))$$

$$e(k) = C(\xi)\hat{x}(k) \quad (50)$$

where the matrix triplet $(A_0(\xi), B_0(\xi), C_0(\xi))$ is the state-space model of the fault-free system at a given value of the scheduling variable $\xi$, e(k) is the residual, and $K_0(\xi)$ is the Kalman gain computed from the statistics of the disturbance and measurement noise.

The KF model is adapted along all the trajectories of the scheduling variable $\xi$ as is the system model. The residual may be expressed as:

$$F_0(z, \xi)e(z) = \psi^T(z)\Delta\theta + e_0(z) \quad (51)$$

where $F_0(z,\xi) = |zI - A_0(\xi) + K_0(\xi)C_0(\xi)|$, $\Delta\theta = \theta(\xi,\gamma) - \theta^0(\xi)$, $e_0(z)$ is a zero-mean white noise process.

From equation (10), $\Delta\theta$ may be expressed as:

$$\Delta\theta = \sum_i \Omega_i(\xi)\Delta\gamma_i + \sum_{i,j} \Omega_{ij}(\xi)\Delta\gamma_i\Delta\gamma_j + \sum_{i,j,k} \Omega_{ijk}(\xi)\Delta\gamma_i\Delta\gamma_j\Delta\gamma_k + \ldots + \sum_{1,2,3\ldots q} \Omega_{123\ldots q}(\xi)\Delta\gamma_1\Delta\gamma_2\Delta\gamma_3 \ldots \Delta\gamma_q \quad (52)$$

Equations (51) and (52) show that the residual is function of the diagnostic parameters and may therefore be employed effectively to isolate parametric faults.

The KF residual is employed herein to estimate the diagnostic parameters for fault isolation as the variance of the residual is both minimum-variance and a zero-mean white noise when the Kalman gain is optimal. Equation (34) may be applied directly to estimate the diagnostic parameters without using a KF. However, the optimality of the estimates may be lost, since the error between the actual output y(k) and the fault-free output $y^0(k)$ may have a larger variance and the noise term may be colored. As a consequence incipient faults may be buried in the noise resulting in a lower probability of correct decision and a higher false alarm probability.

Figure 6:
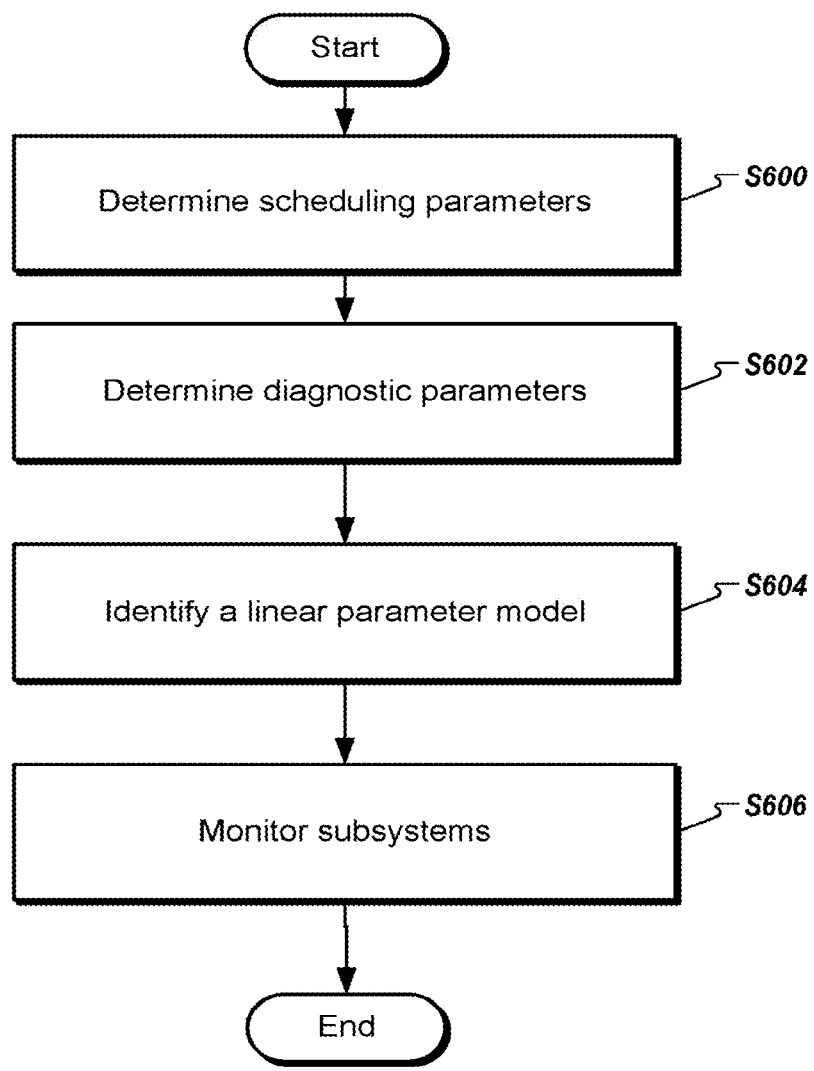
FIG. 6 is a flow chart showing a method for monitoring a status of a system according to one example.

FIG. 6 is a flow chart showing a method for monitoring a status of a system according to one example. At step S600, the CPU 900 may determine scheduling parameters for the system using equations (25), (29), (32), and (33) using data stored in the memory 902. The data are obtained from experiments or sensors as described previously herein. At step S602, the CPU 900 may determine diagnostic parameters. The diagnostic parameters are the parameters of the emulators. In one embodiment, the diagnostic parameters are determined using equation (35). At step S604, the CPU 900 generates the LPV model of the system as described previously herein. The LPV model relates an input, the diagnostic parameters, and the scheduling parameters to an output. At step S606, the CPU 900 may monitor faults in a subsystem as a function of at least the diagnostic parameters. In one example, the CPU 900 may first determine the presence or absence of a fault using the macroscopic status of the system (e.g., using equation (3)). Once a fault is detected, the CPU 900 may determine the size of the fault using the microscopic status of the system.

Figure 7:
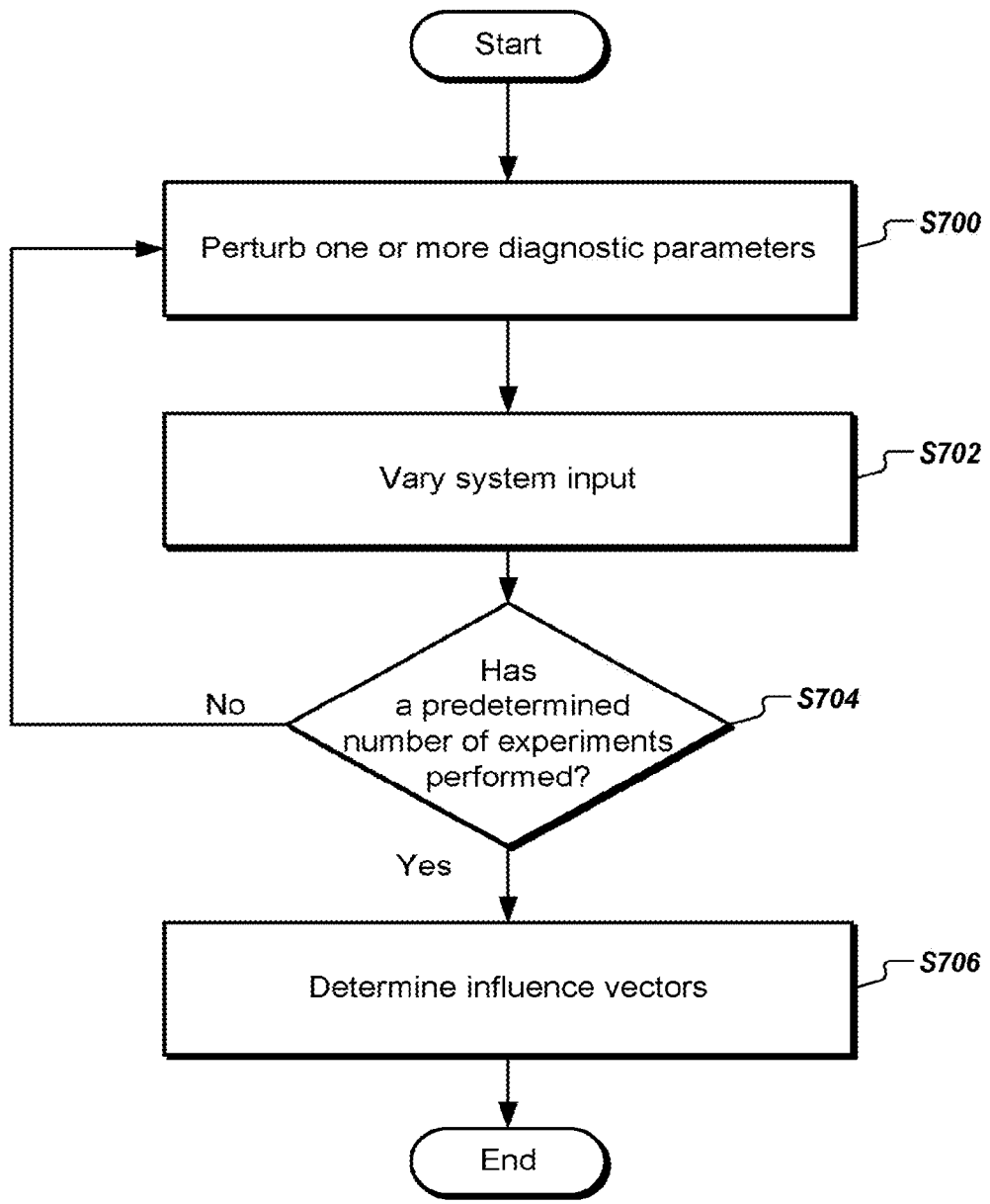
FIG. 7 is a flow chart showing a method for determining influence vectors a system according to one example.

FIG. 7 is a flow chart showing a method for determining influence vectors a system according to one example. As described previously herein, the influence vectors are used to identify the LPV model of the system. At step S700, the CPU 900 may perturb one or more diagnostic parameters determined at step S602. At step S702, the system's input is varied and output sensed. At step S704, the CPU 900 may check to see whether a predetermined number of experiments have been performed. As described previously herein, each experiment represents a perturbation of the one or more diagnostic parameters. In response to determining that that a predetermined number of experiments have been performed, the flow goes to step S706. In response to determining that the predetermined have not been performed the flow goes back to step S700. At step S706, the CPU 900 determines the influence vector.

Figure 8:
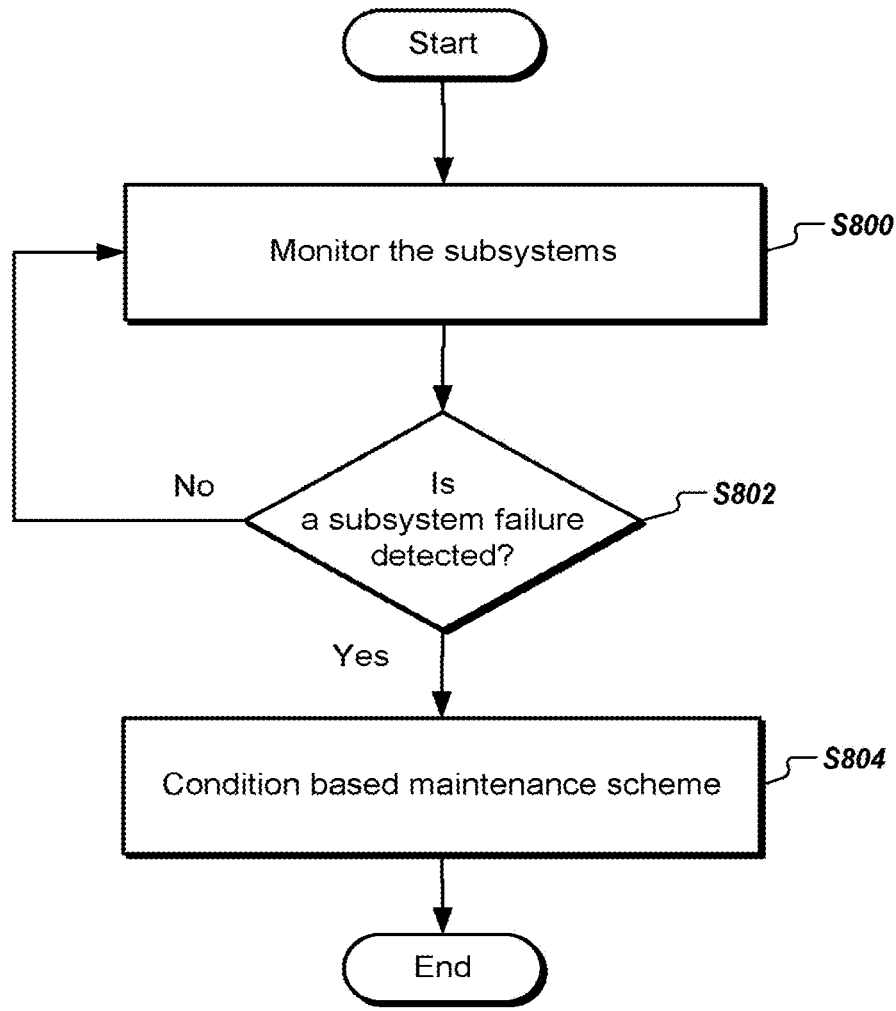
FIG. 8 is a flow chart showing a method for controlling a system according to one example.

FIG. 8 is a flow chart showing a method for controlling a system according to one example. At step S800, the CPU 900 may monitor each of the plurality of subsystems that forms the system. At step S802, the CPU 900 may check to see whether a failure in one or more subsystems is detected. In response to determining that a failure in one or more subsystems has occurred, the flow goes to S804. At step S804, the CPU 900 may perform condition based maintenance on the system as would be understood by one of ordinary skill in the art. Thus, maintenance is only performed when there is a need for it, instead of scheduling it at regular intervals.

Next, a hardware description of the computer 100 according to exemplary embodiments is described with reference to FIG. 9. In FIG. 9, the computer 100 includes a CPU 900 which performs the processes described herein. The process data and instructions may be stored in memory 902. These processes and instructions may also be stored on a storage medium disk 904 such as a hard drive (HDD) or portable storage medium or may be stored remotely. Further, the claimed advancements are not limited by the form of the computer-readable media on which the instructions of the inventive process are stored. For example, the instructions may be stored on CDs, DVDs, in FLASH memory, RAM, ROM, PROM, EPROM, EEPROM, hard disk or any other information processing device with which the computer 100 communicates, such as a server or computer.

Further, the claimed advancements may be provided as a utility application, background daemon, or component of an operating system, or combination thereof, executing in conjunction with CPU 900 and an operating system such as Microsoft Windows 7, UNIX, Solaris, LINUX, Apple MAC-OS and other systems known to those skilled in the art.

In order to achieve the computer 100, the hardware elements may be realized by various circuitry elements, known to those skilled in the art. For example, CPU 900 may be a Xenon or Core processor from Intel of America or an Opteron processor from AMD of America, or may be other processor types that would be recognized by one of ordinary skill in the art. Alternatively, the CPU 900 may be implemented on an FPGA, ASIC, PLD or using discrete logic circuits, as one of ordinary skill in the art would recognize. Further, CPU 900 may be implemented as multiple processors cooperatively working in parallel to perform the instructions of the inventive processes described above.

The computer 100 in FIG. 9 also includes a network controller 906, such as an Intel Ethernet PRO network interface card from Intel Corporation of America, for interfacing with network 928. As can be appreciated, the network 928 can be a public network, such as the Internet, or a private network such as LAN or WAN network, or any combination thereof and can also include PSTN or ISDN sub-networks. The network 928 can also be wired, such as an Ethernet network, or can be wireless such as a cellular network including EDGE, 3G and 4G wireless cellular systems. The wireless network can also be WiFi, Bluetooth, or any other wireless form of communication that is known.

The computer 100 further includes a display controller 908, such as a NVIDIA GeForce GTX or Quadro graphics adaptor from NVIDIA Corporation of America for interfacing with display 910, such as a Hewlett Packard HPL2445w LCD monitor. A general purpose I/O interface 912 interfaces with a keyboard and/or mouse 914 as well as an optional touch screen panel 916 on or separate from display 910. General purpose I/O interface also connects to a variety of peripherals 918 including printers and scanners, such as an OfficeJet or DeskJet from Hewlett Packard.

A sound controller 920 is also provided in the computer 100, such as Sound Blaster X-Fi Titanium from Creative, to interface with speakers/microphone 922 thereby providing sounds and/or music.

The general purpose storage controller 924 connects the storage medium disk 904 with communication bus 926, which may be an ISA, EISA, VESA, PCI, or similar, for interconnecting all of the components of the computer 100. A description of the general features and functionality of the display 910, keyboard and/or mouse 914, as well as the display controller 908, storage controller 924, network controller 906, sound controller 920, and general purpose I/O interface 912 is omitted herein for brevity as these features are known.

The exemplary circuit elements described in the context of the present disclosure may be replaced with other elements and structured differently than the examples provided herein.

Figure 10:
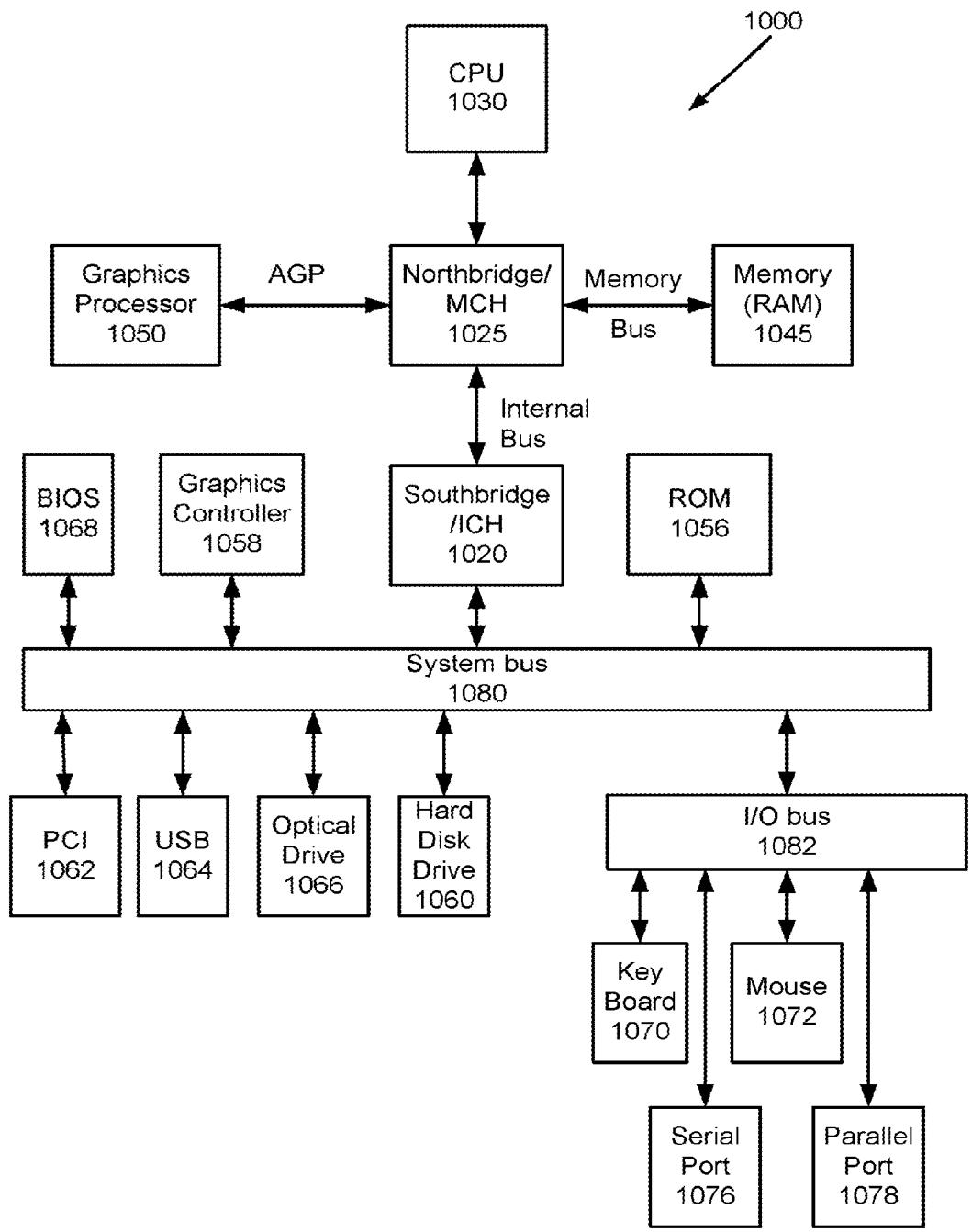
FIG. 10 is an exemplary block diagram of a data processing system according to one example.

FIG. 10 shows a schematic diagram of a data processing system, according to certain embodiments, for monitoring a status of a system utilizing the methodologies described herein. The data processing system is an example of a computer in which specific code or instructions implementing the processes of the illustrative embodiments may be located to create a particular machine for implementing the above-noted process.

Figure 11:
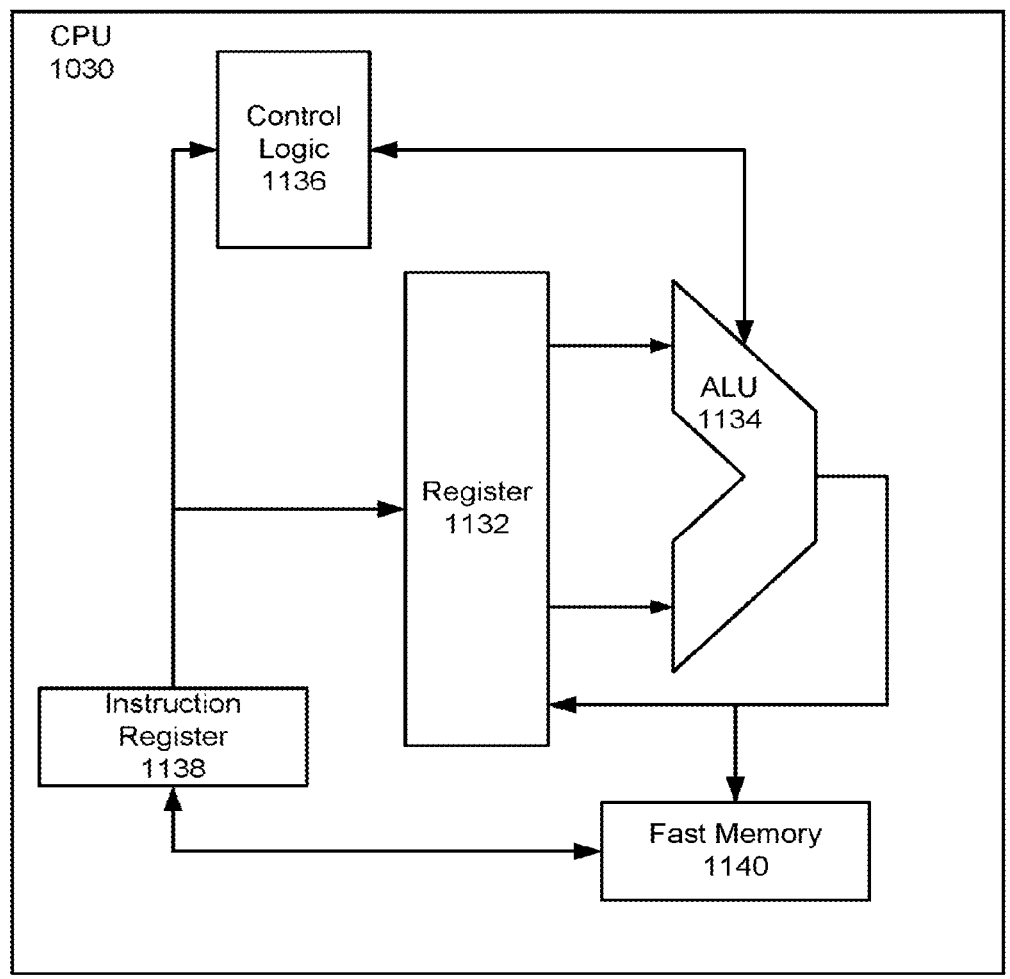
FIG. 11 is an exemplary block diagram of a central processing unit according to one example.

In FIG. 10, data processing system 1000 employs a hub architecture including a north bridge and memory controller hub (NB/MCH) 1025 and a south bridge and input/output (I/O) controller hub (SB/ICH) 1020. The central processing unit (CPU) 1030 is connected to NB/MCH 1025. The NB/MCH 1025 also connects to the memory 1045 via a memory bus, and connects to the graphics processor 1050 via an accelerated graphics port (AGP). The NB/MCH 1025 also connects to the SB/ICH 1020 via an internal bus (e.g., a unified media interface or a direct media interface). The CPU 1030 may contain one or more processors and may even be implemented using one or more heterogeneous processor systems. For example, FIG. 11 shows one implementation of CPU 1030.

Further, in the data processing system 1000 of FIG. 10, SB/ICH 1020 is coupled through a system bus 1080 to an I/O Bus 1082, a read only memory (ROM) 1056, an universal serial bus (USB) port 1064, a flash binary input/output system (BIOS) 1068, and a graphics controller 1058. In one implementation, the I/O bus can include a super I/O (SIO) device.

PCI/PCIe devices can also be coupled to SB/ICH 1020 through a PCI bus 1062. The PCI devices may include, for example, Ethernet adapters, add-in cards, and PC cards for notebook computers. Further, the hard disk drive (HDD) 1060 and optical drive 1066 can also be coupled to the SB/ICH 1020 through the system bus 1080. The Hard disk drive 1060 and the optical drive or CD-ROM 1066 can use, for example, an integrated drive electronics (IDE) or serial advanced technology attachment (SATA) interface.

In one implementation, a keyboard 1070, a mouse 1072, a serial port 1076, and a parallel port 1078 can be connected to the system bus 1080 through the I/O bus 1082. Other peripherals and devices that can be connected to the SB/ICH 1020 include a mass storage controller such as SATA or PATA (Parallel Advanced Technology Attachment), an Ethernet port, an ISA bus, a LPC bridge, SMBus, a DMA controller, and an Audio Codec (not shown).

In one implementation of CPU 1030, the instruction register 1138 retrieves instructions from the fast memory 1140. At least part of these instructions are fetched from the instruction register 1138 by the control logic 1136 and interpreted according to the instruction set architecture of the CPU 1030. Part of the instructions can also be directed to the register 1132. In one implementation, the instructions are decoded according to a hardwired method, and in another implementation, the instructions are decoded according a microprogram that translates instructions into sets of CPU configuration signals that are applied sequentially over multiple clock pulses. After fetching and decoding the instructions, the instructions are executed using the arithmetic logic unit (ALU) 1134 that loads values from the register 1132 and performs logical and mathematical operations on the loaded values according to the instructions. The results from these operations can be feedback into the register and/or stored in the fast memory 1140. According to certain implementations, the instruction set architecture of the CPU 1030 can use a reduced instruction set architecture, a complex instruction set architecture, a vector processor architecture, a very large instruction word architecture. Furthermore, the CPU 1030 can be based on the Von Neuman model or the Harvard model. The CPU 1030 can be a digital signal processor, an FPGA, an ASIC, a PLA, a PLD, or a CPLD. Further, the CPU 1030 can be an x86 processor by Intel or by AMD; an ARM processor, a Power architecture processor by, e.g., IBM; a SPARC architecture processor by Sun Microsystems or by Oracle; or other known CPU architecture.

The present disclosure is not limited to the specific circuit elements described herein, nor is the present disclosure limited to the specific sizing and classification of these elements. For example, the skilled artisan will appreciate that the circuitry described herein may be adapted based on changes on battery sizing and chemistry, or based on the requirements of the intended back-up load to be powered.

The functions and features described herein may also be executed by various distributed components of a system. For example, one or more processors may execute these system functions, wherein the processors are distributed across multiple components communicating in a network. The distributed components may include one or more client and server machines, which may share processing in addition to various human interface and communication devices (e.g., display monitors, smart phones, tablets, personal digital assistants (PDAs)). The network may be a private network, such as a LAN or WAN, or may be a public network, such as the Internet. Input to the system may be received via direct user input and received remotely either in real-time or as a batch process. Additionally, some implementations may be performed on modules or hardware not identical to those described. Accordingly, other implementations are within the scope that may be claimed.

The above-described hardware description is a non-limiting example of corresponding structure for performing the functionality described herein.

The hardware description above, exemplified by any one of the structure examples shown in FIG. 9 or 10, constitutes or includes specialized corresponding structure that is programmed or configured to perform the algorithm shown in FIGS. 6, 7, and 8.

A system which includes the features in the foregoing description provides numerous advantages to users. In particular, the LPV model and methodologies described herein may be used for fault detection and isolation. The method not only captures the variations of the dynamics of the system via scheduling variables, but also the variations in the diagnostic parameters. The method is based on the emulators, influence vectors, and diagnostic parameters scheduling. The feature vector and influence vectors are estimated reliably by employing parameter-perturbed experiments. The KF is used to detect and isolate faults by using an expression for the residual as an explicit function of the diagnostic parameters. The KF based fault detection has the advantage of increasing the probability of correct decision and lowering false alarm probability. Thus, the present disclosure provides an improvement to the technical field of system monitoring. In addition, the present disclosure has the advantage to minimize computation. Thus, the present disclosure improves the functioning of the computer by increasing processing speed, decreasing power consumption and resulting in a chip area reduction.

Obviously, numerous modifications and variations are possible in light of the above teachings. It is therefore to be understood that within the scope of the appended claims, the invention may be practiced otherwise than as specifically described herein.

Thus, the foregoing discussion discloses and describes merely exemplary embodiments of the present invention. As will be understood by those skilled in the art, the present invention may be embodied in other specific forms without departing from the spirit or essential characteristics thereof. Accordingly, the disclosure of the present invention is intended to be illustrative, but not limiting of the scope of the invention, as well as other claims. The disclosure, including any readily discernible variants of the teachings herein, defines, in part, the scope of the foregoing claim terminology such that no inventive subject matter is dedicated to the public.

The invention claimed is:

1. A method of fault diagnosis comprising:
   determining, using processing circuitry, scheduling parameters of a system wherein the system includes a plurality of subsystems;
   determining, using the processing circuitry, diagnostic parameters of the system;
   generating, using the processing circuitry, a linear parameter varying (LPV) model wherein the model relates an input, the diagnostic parameters, and the scheduling parameters to an output;
   calculating a first vector estimate $x_{Qo}$ associated with a first matrix by applying
   $$\hat{x}_{Q_0} = (\rho(\xi)\widehat{x}\psi_o^T(k))^\dagger y^o(k)$$
   where $\rho(\xi)$ is a deviation vector, $\psi_o$ is a data matrix, and $y^o$ is an output vector;
   identifying the LPV model by estimating recursively using singular value decomposition matrices using data obtained by perturbing one or more diagnostic parameters and the first matrix which is determined with no perturbations, wherein the identifying includes applying the following formulation:
   $$\hat{x}_{Q_i} = (\rho(\xi)\widehat{x}\psi_i^T(k)\Delta\gamma_i)^\dagger (y^i(k) - \psi_i^T(k)\hat{Q}_0\rho(k));$$
   $$\hat{x}_{Q_{ij}} = (\rho(\xi)\widehat{x}\psi_{ij}^T(k)\Delta\gamma_i\Delta\gamma_j)^\dagger (y^{ij}(k) - \psi_{ij}^T(k)(\hat{Q}_0(\xi) + \hat{Q}_i(\xi)\Delta\gamma_i + \hat{Q}_j(\xi)\Delta\gamma_j)\rho(\xi));$$
   and
   $$\hat{x}_{Q_{ijk}} = (\rho(\xi)\widehat{x}\psi_{ijk}^T(k)\Delta\gamma_i\Delta\gamma_j\Delta\gamma_k)^\dagger (y^{ijk}(k) - \psi_{ijk}^T(k)(\hat{Q}_0 + \hat{Q}_i(\xi)\Delta\gamma_i + \hat{Q}_j(\xi)\Delta\gamma_j + \hat{Q}_k(\xi)\rho(\xi)\Delta\gamma_k + \hat{Q}_{ij}(\xi)\rho(\xi)\Delta\gamma_i\Delta\gamma_j)\rho(\xi))$$
   where $x_{Qi}$, $x_{Qij}$, $x_{Qijk}$ are vector estimates associated with matrices;
   monitoring each of the plurality of subsystems as a function of the identified LPV model;
   scheduling the LPV model to track variations in an operating regime; and
   diagnosing one more faults of one or more components of the system using the generated LPV model.

2. The method of claim 1, wherein the LPV model is characterized by a feature vector and influence vectors wherein each of the influence vectors is identified by performing a number of experiments.

3. The method of claim 2, wherein each experiment includes perturbing one or more parameter of the diagnostic parameters and varying the input of the system.

4. The method of claim 2, wherein the feature vector and the influence vectors are estimated using a least squares technique using singular value decomposition.

5. The method of claim 1, wherein the diagnostic parameters are a function of emulators simulating a plurality of fault scenarios.

6. The method of claim 5, wherein the emulators emulate variations in a phase and magnitude of a transfer function of each subsystem.

7. The method of claim 5, wherein the emulators emulate variations in parameters characterizing each subsystem.

8. The method of claim 1, wherein the diagnosing step is based on a Kalman filter.

9. The method of claim 1, wherein the model is $$y(k) = \psi^T(k)\left( Q_0(\xi)\rho(\xi) + \sum_i Q_i(\xi)\rho(\xi)\Delta\gamma_i + \sum_{i,j} Q_{ij}(\xi)\rho(\xi)\Delta\gamma_i\Delta\gamma_j + \sum_{i,j,k} Q_{ijk}(\xi)\rho(\xi)\Delta\gamma_i\Delta\gamma_j\Delta\gamma_k + \sum_{1,2,3,\ldots q} Q_{1,2,3,\ldots q}(\xi)\rho(\xi)\Delta\gamma_1\Delta\gamma_2\Delta\gamma_3\ldots\Delta\gamma_q \right) + v(k)$$

where $\psi$ is a data vector, Q are the matrices associated, $\Delta\gamma$ is the variations of each of the diagnostic parameters, v is a noise vector.

10. An apparatus for fault diagnosis comprising:
    processing circuitry configured to:
    determine scheduling parameters of a system wherein the system includes a plurality of subsystems;
    determine diagnostic parameters of the system;
    generate a linear parameter varying (LPV) model wherein the model relates an input, the diagnostic parameters, and the scheduling parameters to an output;
    calculate a first vector estimate XQo associated with a first matrix by applying
    $$\hat{x}_{Q_0} = (\rho(\xi)\widehat{x}\psi_o^T(k))^\dagger y^o(k)$$
    where $\rho(\xi)$ is a deviation vector, $\psi_o$ is a data matrix, and $y^o$ is an output vector;
    identify the LPV model by estimating recursively using singular value decomposition matrices using data obtained by perturbing one or more diagnostic parameters and the first matrix which is determined with no perturbations, wherein the identifying includes applying the following formulation:
    $$\hat{x}_{Q_i} = (\rho(\xi)\widehat{x}\psi_i^T(k)\Delta\gamma_i)^\dagger (y^i(k) - \psi_i^T(k)\hat{Q}_0\rho(k));$$
    $$\hat{x}_{Q_{ij}} = (\rho(\xi)\widehat{x}\psi_{ij}^T(k)\Delta\gamma_i\Delta\gamma_j)^\dagger (y^{ij}(k) - \psi_{ij}^T(k)(\hat{Q}_0(\xi) + \hat{Q}_i(\xi)\Delta\gamma_i + \hat{Q}_j(\xi)\Delta\gamma_j)\rho(\xi));$$
    and
    $$\hat{x}_{Q_{ijk}} = (\rho(\xi)\widehat{x}\psi_{ijk}^T(k)\Delta\gamma_i\Delta\gamma_j\Delta\gamma_k)^\dagger (y^{ijk}(k) - \psi_{ijk}^T(k)(\hat{Q}_0 + \hat{Q}_i(\xi)\Delta\gamma_i + \hat{Q}_j(\xi)\Delta\gamma_j + \hat{Q}_k(\xi)\rho(\xi)\Delta\gamma_k + \hat{Q}_{ij}(\xi)\rho(\xi)\Delta\gamma_i\Delta\gamma_j)\rho(\xi))$$
    where $x_{Qi}$, $x_{Qij}$, $x_{Qijk}$ are vector estimates associated with matrices; and
    monitor each of the plurality of subsystems as a function of the identified LPV model;
    monitoring each of the plurality of subsystems as a function of the identified LPV model;
    scheduling the generated LPV model to track variations in an operating regime; and
    diagnosing one more faults of one or more component of the system using the generated LPV model.

11. The apparatus of claim 10, wherein the LPV model is characterized by a feature vector and influence vectors wherein each of the influence vectors is identified by performing a number of experiments.

12. The apparatus of claim 10, wherein each experiment includes perturbing one or more parameter of the diagnostic parameters and varying the input of the system.

13. The apparatus of claim 11, wherein the feature vector and the influence vectors are estimated using a least squares technique using singular value decomposition.

14. The apparatus of claim 10, wherein the diagnostic parameters are a function of emulators simulating a plurality of fault scenarios.

15. The apparatus of claim 14, wherein the emulators emulate variations in a phase and magnitude of a transfer function of each subsystem.

16. The apparatus of claim 14, wherein the emulators emulate variations in parameters characterizing each subsystem.

17. A non-transitory computer readable medium storing computer-readable instructions therein which when executed by a computer cause the computer to perform a method of fault diagnosis comprising:
determining scheduling parameters of a system wherein the system includes a plurality of subsystems;
determining diagnostic parameters of the system;
generating a linear parameter varying (LPV) model wherein the model relates an input, the diagnostic parameters, and the scheduling parameters to an output;
calculating a first vector estimate $x_{Q_o}$ associated with a first matrix by applying $$\hat{x}_{Q_0} = (\rho(\xi) \otimes \psi_0^T(k))^\dagger y^o(k)$$

where $\rho(\xi)$ is a deviation vector, $\psi_o$ is a data matrix, and $y^o$ is an output vector;
identifying the LPV model by estimating recursively using singular value decomposition matrices using data obtained by perturbing one or more diagnostic parameters and the first matrix which is determined with no perturbations, wherein the identifying includes applying the following formulation:

$$\hat{x}_{Q_i} = (\rho(\xi) \otimes \Psi_i^T(k)\Delta\gamma_i)^\dagger (y^i(k) - \Psi_i^T(k)\hat{Q}_0\rho(k));$$

$$\hat{x}_{Q_{ij}} = (\rho(\xi) \otimes \Psi_{ij}^T(k)\Delta\gamma_i\Delta\gamma_j)^\dagger$$
$$(y^{ij}(k) - \Psi_{ij}^T(k)(\hat{Q}_0(\xi) + \hat{Q}_i(\xi)\Delta\gamma_i + \hat{Q}_j(\xi)\Delta\gamma_j)\rho(\xi)); \text{ and}$$

$$\hat{x}_{Q_{ijk}} = (\rho(\xi) \otimes \Psi_{ijk}^T(k)\Delta\gamma_i\Delta\gamma_j\Delta\gamma_k)^\dagger$$
$$(y^{ijk}(k) - \Psi_{ijk}^T(k)(\hat{Q}_0 + \hat{Q}_i(\xi)\Delta\gamma_i + \hat{Q}_j(\xi)\Delta\gamma_j +$$
$$\hat{Q}_k(\xi)\rho(\xi)\Delta\gamma_k + \hat{Q}_{ij}(\xi)\rho(\xi)\Delta\gamma_i\Delta\gamma_j)\rho(\xi))$$

where $x_{Q_i}$, $x_{Q_{ij}}$, $x_{Q_{ijk}}$ are vector estimates associated with matrices;
monitoring each of the plurality of subsystems as a function of the identified LPV model;
scheduling the generated LPV model to track variations in an operating regime; and
diagnosing one more faults of one or more component of the system using the generated LPV model.

* * * * *